US009444244B2

(12) United States Patent
Hooper et al.

(10) Patent No.: US 9,444,244 B2
(45) Date of Patent: Sep. 13, 2016

(54) SIGNAL-ACTIVATED CIRCUIT INTERRUPTER

(71) Applicants: Donald Randolph Hooper, Tukwila, WA (US); Danial L. Aalberg, Renton, WA (US)

(72) Inventors: Donald Randolph Hooper, Tukwila, WA (US); Danial L. Aalberg, Renton, WA (US)

(*) Notice: Subject to any disclaimer, the term of this patent is extended or adjusted under 35 U.S.C. 154(b) by 150 days.

(21) Appl. No.: 14/552,929

(22) Filed: Nov. 25, 2014

(65) Prior Publication Data
US 2015/0077243 A1 Mar. 19, 2015

Related U.S. Application Data

(63) Continuation-in-part of application No. 13/588,657, filed on Aug. 17, 2012, now abandoned.

(60) Provisional application No. 61/575,177, filed on Aug. 17, 2011.

(51) Int. Cl.
| | |
|---|---|
| H02H 3/00 | (2006.01) |
| H02H 3/16 | (2006.01) |
| G08B 17/10 | (2006.01) |
| G08B 17/06 | (2006.01) |
| H02H 1/00 | (2006.01) |
| B60L 3/04 | (2006.01) |
| B60L 3/00 | (2006.01) |
| G01R 31/02 | (2006.01) |
| H01H 83/20 | (2006.01) |
| H01H 83/22 | (2006.01) |

(52) U.S. Cl.
CPC ............ *H02H 3/165* (2013.01); *G08B 17/06* (2013.01); *G08B 17/10* (2013.01); *H02H 1/0007* (2013.01); *H02H 3/16* (2013.01); *B60L 3/0069* (2013.01); *B60L 3/04* (2013.01); *G01R 31/025* (2013.01); *H01H 83/20* (2013.01); *H01H 83/22* (2013.01); *H01H 2239/054* (2013.01); *Y02T 90/14* (2013.01)

(58) Field of Classification Search
USPC .................................................... 361/42–50
See application file for complete search history.

(56) References Cited

U.S. PATENT DOCUMENTS

| | | | |
|---|---|---|---|
| 3,213,321 | A | 10/1965 | Dalziel |
| 3,376,477 | A | 4/1968 | Weinger |
| 3,525,018 | A | 8/1970 | Murphy |
| 3,611,038 | A | 10/1971 | Benham |

(Continued)

FOREIGN PATENT DOCUMENTS

WO WO 2014/037935 A1 3/2014

*Primary Examiner* — Danny Nguyen
(74) *Attorney, Agent, or Firm* — Kal K Lambert; Lambert Patent Services LLC

(57) ABSTRACT

The current invention is an automatic AC power interruption system built into a portable apparatus or integrated into electrical systems and appliance control circuitry. Power is interrupted in potentially hazardous conditions, for example, when a T3 smoke detector alarm signal is detected. Alternatively, a portable device may be plugged into a power outlet having a GFCI breaker and, when a hazard alarm condition is detected, trip off power to the outlet. Signal-activated circuit interrupters (SACIs) may be integrated into appliance control circuitry and interrupt power to a problematic device when a hazard alarm condition is detected. In addition to fire prevention, other hazard alarm conditions may include alarms indicating toxic fumes, motor overload, natural gas, radon, or carbon monoxide. Interconnected networks of signal-activated circuit interrupters are also disclosed.

21 Claims, 15 Drawing Sheets

(56) References Cited

U.S. PATENT DOCUMENTS

| | | |
|---|---|---|
| 3,772,569 A | 11/1973 | Wible |
| 4,171,944 A | 10/1979 | Hirschmann |
| 4,586,031 A | 4/1986 | Grinneiser |
| 4,991,145 A | 2/1991 | Goldstein |
| 5,162,777 A | 11/1992 | Kolbatz |
| 5,508,568 A | 4/1996 | Mammen |
| 5,945,924 A | 8/1999 | Marman |
| 5,999,384 A | 12/1999 | Chen |
| 6,553,100 B1 | 4/2003 | Chen |
| 7,477,144 B2 | 1/2009 | Albert |
| 7,522,035 B2 | 4/2009 | Albert |
| 8,203,308 B1 * | 6/2012 | Guo ............... B60L 3/0069 320/119 |
| 2004/0145467 A1 | 7/2004 | Roby |
| 2005/0280961 A1 | 12/2005 | Campolo |
| 2005/0286184 A1 | 12/2005 | Campolo |
| 2008/0018484 A1 | 1/2008 | Sager |
| 2009/0222142 A1 * | 9/2009 | Kao ............... G05B 15/02 700/291 |
| 2009/0326855 A1 | 12/2009 | Bartonek |

* cited by examiner

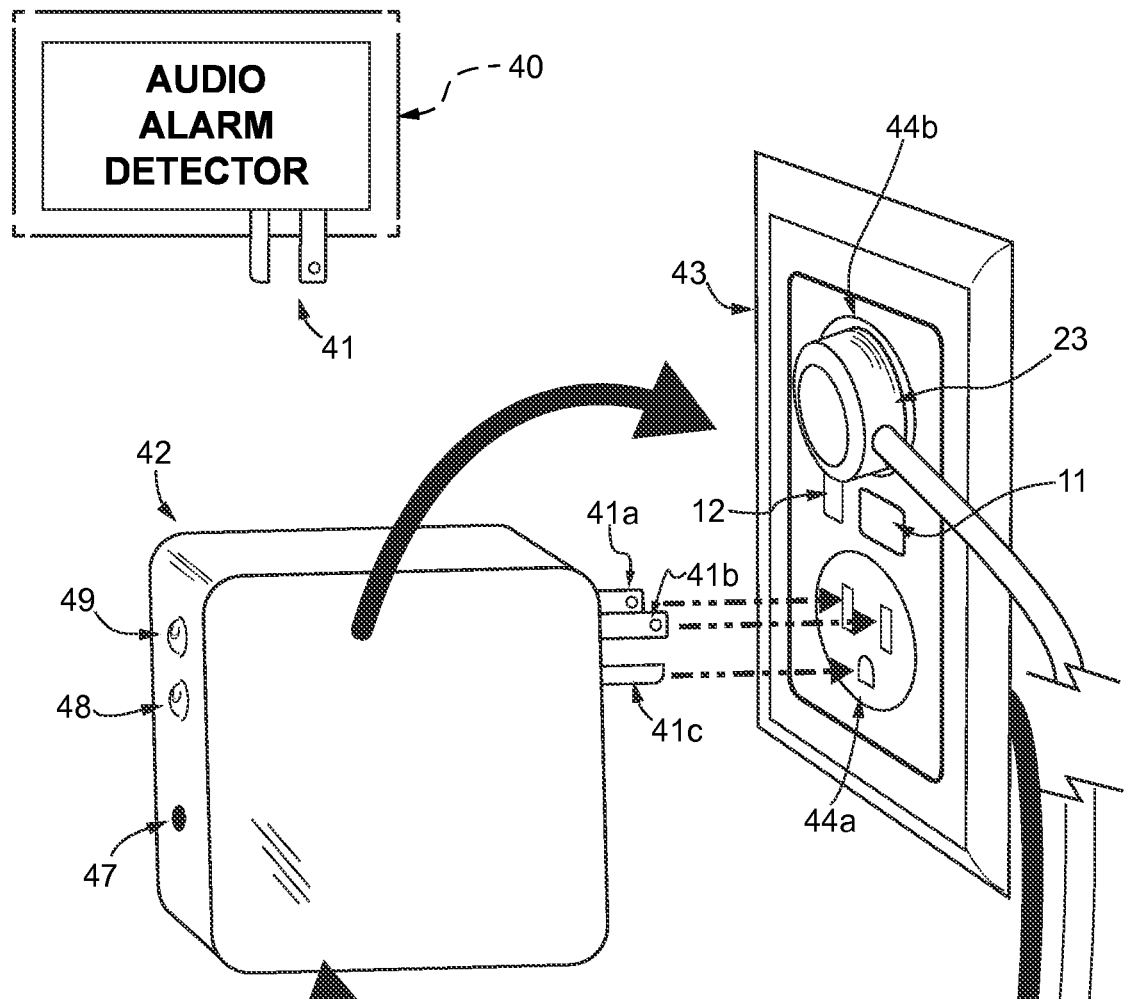

PROPAGATION OF ALARM
THROUGH NETWORK

SIGNAL-ACTIVATED CIRCUIT INTERRUPTER

CROSS REFERENCE TO RELATED APPLICATIONS

This application is a continuation-in-part of U.S. patent application Ser. No. 13/588,657, filed 17 Aug. 2012, which claims the benefit of priority under 35 U.S.C. §119(e) from U.S. Provisional Patent Application No. 61/575,177, filed 17 Aug. 2011, said patent documents being incorporated herein in entirety for all purposes by reference.

GOVERNMENT SUPPORT

Not Applicable.

FIELD OF THE INVENTION

The present invention is in the field of electrical power supply. More particularly, the present invention is in the technical field of electrical safety devices and relates to activation of GFCI circuit breakers in hazard conditions associated with an audible alarm.

BACKGROUND

Wherever electrical circuits provide power to appliances, motors, and other equipment, it is desirable to electronically monitor the environment for hazardous conditions and, when detected, generate an audible alarm to warn people and protect property. For example, smoke detectors generate an audible alarm, but other detectors may warn of toxic fumes, motor overload, flammable gases, radon, carbon monoxide, fire, or other hazardous conditions. The invention will interrupt electric power to select circuits when it detects a hazardous condition alarm in order to prevent personal injuries, prevent fires, facilitate fire suppression, and protect property. The source of the alarm signal could be any audible, visible or invisible light, radio frequency, or other type signal, or combination of signals, generated by a device tuned to detect the presence of hazardous conditions. The invention may protect a power strip, wall outlet, or electrical panel circuit, or the invention may be integrated into the control circuitry of an individual appliance or machine.

DESCRIPTION OF RELEVANT ART

U.S. Pat. No. 5,508,568 issued to Alex Mammen on Apr. 16, 1996, describes a power receptacle adaptor having an internal relay that responds to an audible smoke alarm signal by disconnecting power from any appliances plugged into the receptacle. The circuit is not configured to differentiate particular alarm signals, and thus may be set off non-specifically by a variety of environmental noises, however brief. Also the device is not compatible with ground fault circuit interrupt (GFCI) breakers and could defeat their function, resulting in an unsafe condition for fire responders.

U.S. Pat. No. 7,154,402, issued to Michael Dayoub on Dec. 26, 2006, describes a power strip with a built-in smoke only detector and auto-shutoff, with indicators and switches, all in a single unit. This arrangement requires the power strip be permanently mounted nearby and above the appliance to be monitored for smoke, and additional appliances plugged into its receptacles may not be protected. This emphasizes the need for a simple portable power strip separate from the hazard detector and able to respond to any smoke detector alarm within its range.

U.S. Pat. Publ. No. 2008/0018484, dated Jan. 24, 2008, describes an automatic power interruption system wherein a smoke detector broadcasts a radio frequency (RF) alarm to a remote RF receiver that causes a specific circuit breaker in the electrical panel box to be tripped open. The disadvantages of this arrangement include that power is interrupted to all appliances on the circuit tripped, it requires professional installation, and it is difficult to reset the circuit while monitoring for the defective appliance. This emphasizes the need for a simple portable unit where the appliances, plugs, and reset button are nearby the operator.

U.S. Pat. No. 7,522,035, issued to InnovAlarm Corp. on Apr. 21, 2009, for a sound monitoring and alarm response method, system and device that detects a variety of smoke alarm signals and generates a wake-up alarm at the consumer's bedside. The disadvantage of this bedside monitor is that it does not, and is not intended to, interrupt power to any appliance.

This emphasizes the need for a simple apparatus that may be positioned to automatically interrupt power (an ignition source) to specific appliances and circuits and will respond to a hazard condition at any time of day or night by cutting power to suspect appliances or circuits. Preferably the apparatus may be used with a variety of existing circuits having GFCI breakers, such that the appliances, plugs, and reset button are nearby the operator. A preferred apparatus will also have at least a limited capacity to demonstrate an "open circuit" (breaker tripped) condition visually. It may also offer the option of being formed into networks such that as a hazard condition increases, power to larger affected areas is increasingly cut off, relieving danger of electrocution for emergency responders.

SUMMARY

A FIRST EMBODIMENT of the invention is a power strip casing and internal components that cut off alternating current (AC) electrical power to its receptacles when a hazard alarm is detected. During normal operation, power flows through the power strip to AC outlets and to whatever appliances are plugged in. When an alarm signal from a hazard detector is sensed, the control circuitry shuts off power to all outlet receptacles on the power strip until the user manually resets the device. The first embodiment of the invention does not require the AC receptacle into which it is plugged be protected with any type of GFCI device.

A SECOND EMBODIMENT of the invention integrates the invention into the control circuitry of an appliance, machine or other equipment. During normal operation, power flows to an appliance, machine, or other equipment and, when a hazard alarm is sensed, the invention initiates a controlled shutdown and power cut off. The second embodiment of the invention does not require the AC circuit with which it is connected be protected with any type of GFCI device.

A THIRD EMBODIMENT of the invention is a small portable device having internal circuitry, openings, and a standard three-prong electrical plug, which can be plugged into a power strip, wall outlet, or other electrical receptacle. During normal operation, power flows to whatever appliances are plugged into a power strip, wall outlet, or other receptacle, to which the portable device is electrically attached. When the invention senses a hazard alarm, an amperage variance is generated in the portable device, such that the amperage is sufficient to trip off the nearest GFCI breaker in electrical contact with the device, which cuts off AC electrical power to all appliances plugged into the corresponding power strip, wall outlet, or electrical panel downstream from the breaker. AC power is restored to the receptacles by the consumer pressing the affected GFCI's reset button if the hazard condition has been relieved. The third embodiment of the invention requires that the portable device act cooperatively with an AC circuit having a standard GFCI device.

A FOURTH EMBODIMENT of the invention integrates an apparatus of the invention into the control circuitry of an appliance, machine or other equipment. During normal operation, power flows to an appliance, machine, or other equipment and, when a hazard alarm is sensed, the invention initiates a controlled shutdown and then generates an amperage variance to trip off the nearest (i.e., most proximate "upstream" in a series circuit) GFCI. The fourth embodiment of the invention requires that the integrated apparatus act cooperatively with an AC circuit having a standard GFCI device.

In selected embodiments of the invention, the hazard alarm signal sensor typically monitors for an audible alarm, such as a smoke detector. It may detect any audible, visible or invisible light, radio frequency, or other type of signal, or combination of signals, generated by a device tuned to detect the presence of hazardous conditions. In addition, the alarm sensor may be adjustable to respond to whatever frequency or pattern of signals the hazard alarm emits.

In a preferred embodiment, the inventive device is simple; that is, it can be unplugged from one outlet and moved to another outlet, ready to respond to hazard alarm signals in the new environment. In this instance, the invention only operates on appliances the user chooses to plug into wall outlet or electrical panel that is electrically connected to the inventive device; the invention neither hides nor obstructs other unused wall outlets, thus providing the user a choice of operating an appliance with signal-activated circuit interruption protection, or without.

The inventive apparatus supports the existing features of the outlet into which it is plugged; that is, it will not interfere with the normal operations of the source outlet, such as any ground fault interrupt device, arc fault circuit breaker, surge protection, uninterruptable power supply, or power overload breakers that are part of the circuit.

The invention responds to all types of hazard alarms within its range that match its hazard alarm definitions. When the invention has interrupted power to its receptacles, the user can plainly see which appliances are plugged into the invention in order to determine which, if any, created smoke or other fumes and thus caused the pre-existing hazard detector to emit its hazard alarm.

In other embodiments, an integrated signal-activated circuit interrupt apparatus with or without GFCI will respond to all types of hazard alarms within its range that match its hazard alarm definition. The invention interrupts power to the appliance, machine or other equipment until the user is satisfied that it is not the cause of the alarm or until it is repaired and the user must manually reset the power, and the invention can be incorporated within particular models of appliances, machines, or other equipment as a built-in safety feature.

Advantageously, the apparatus and devices of the invention may be formed into networks, and achieve unexpected and synergic properties in detecting making safe responses to hazardous conditions. These and other features of the present invention will become readily apparent upon further review of the following specification and drawings.

BRIEF DESCRIPTION OF THE DRAWINGS

The teachings of the present invention are more readily understood by considering the drawings, in which:

FIG. 4A is a schematic representation of a portable acoustic alarm detector device for use in the feedback loop power shutoff system of FIG. 4B.

Figure 1A:
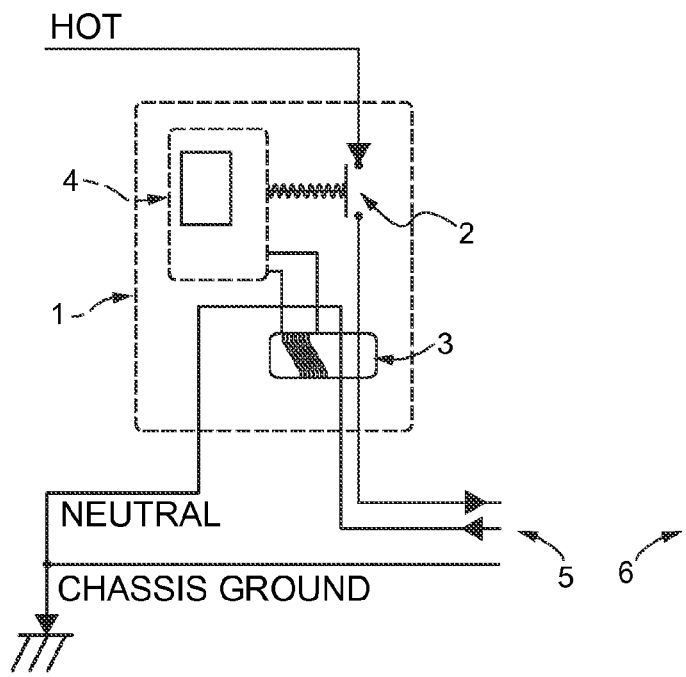
FIGS. 1A, 1B and 1C are views of prior art devices and a context of use.

The drawing figures are not necessarily to scale. Certain features or components herein may be shown in somewhat schematic form and some details of conventional elements may not be shown in the interest of clarity, explanation, and conciseness. The drawing figures are hereby made part of the specification, written description and teachings disclosed herein.

GLOSSARY

Certain terms are used throughout the following description to refer to particular features, steps or components, and are used as terms of description and not of limitation. As one skilled in the art will appreciate, different persons may refer to the same feature, step or component by different names. Components, steps or features that differ in name but not in structure, function or action are considered equivalent and not distinguishable, and may be substituted herein without departure from the invention. Certain meanings are defined here as intended by the inventors, i.e., they are intrinsic meanings. Other words and phrases used herein take their meaning as consistent with usage as would be apparent to one skilled in the relevant arts. The following definitions supplement those set forth elsewhere in this specification. Unless otherwise defined, all technical and scientific terms used herein have the same meaning as commonly understood by one of ordinary skill in the art to which this invention belongs. In case of conflict, the present specification, including definitions, will control.

"Ground fault circuit interrupt" (GFCI) refers to a device of the prior art having a sensing transformer for detecting ground leakage and in response, throwing a breaker that cuts power to the affected downstream circuits. It is known in the art that multiple series downstream circuits or outlets may be "daisy chained" from a single GFCI device. Art related to ground fault interrupt circuits is described in U.S. Pat. Nos. 3,213,321, 3,376,477, 3,407,337, 3,525,018 and 3,772,569 and is incorporated in full by reference.

"Microphone" is a device for converting sound waves into an electrical signal, which may then be processed using analog or digital means. A microphone may contain a flexible diaphragm composed of film or foil that vibrates in response to a sound wave. The diaphragm movement modulates an electrical current by various methods. In a "carbon mike" (used in telephones for more than a hundred years) the diaphragm alters the pressure in carbon grains, changing its resistance. In a "condenser mike" (also called an "electrostatic mike" or "capacitor mike") the diaphragm changes the capacitance between itself and a metal plate, both acting as electrodes. The widely used "electret mike" has a charged dielectric between the electrodes that generates voltage. In a "crystal" microphone, a piezoelectric diaphragm or pressure sensor is used to produce a modulated voltage when subjected to the sound waves.

Audio signals associated with hazard conditions may be coded. For example a Temporal T3 signal has a particular frequency and a particular pattern of three beeps or pulses followed by a pause. The frequency has been established by regulatory agencies, and is generally 3100 Hz in older units and 520 Hz in newer units. A T4 signal (which is used in carbon monoxide detectors) typically has 4 beeps or pulses followed by a pause. Natural gas alarms and other alarms may also be encoded. A Ground fault alarm may have a signature alarm signal when used as part of a protective network of signal-activated circuit interrupters of yet another embodiment of the invention.

An "amperage variance switch" is a circuit that is electrically connected or plugged into a power supply and is enabled to detect a current output from a sensing transformer and generate a signal to a circuit breaker, tripping the breaker. Typically the breaker is a conventional GFCI device but the amperage variance switch is improved by combination with component circuitry having the capacity to detect other alarm conditions and to digitally convey those to a trip subcircuit for interrupting power to any devices, circuits, appliances (and so forth), that are connected in series to the protected power supply.

A "trip subcircuit" "trip switch" or "trip gate" is a short circuit bridging a current lead and a ground lead of a grounded power supply circuit, where the switch is generally configured to convey a few milliamps from the hot to the ground, and is protected by a resistor to prevent larger current flow. The short circuit is generally "off", and power does not flow through the switch unless actuated, generally by an actuation signal indicating a hazard condition that may be indirectly associated with the power supply circuit.

General connection terms including, but not limited to "connected," "attached," "conjoined," "secured," and "affixed" are not meant to be limiting, such that structures so "associated" may have more than one way of being associated. "Electrically connected" indicates a connection for conveying a current or a voltage therethrough; "digitally connected" indicates a connection for conveying a digital signal therethrough; "mechanically connected" indicates a connection or linkage for conveying a force therethrough, and so forth.

Relative terms should be construed as such. For example, the term "front" is meant to be relative to the term "back," the term "upper" is meant to be relative to the term "lower," the term "vertical" is meant to be relative to the term "horizontal," the term "top" is meant to be relative to the term "bottom," and the term "inside" is meant to be relative to the term "outside," and so forth. Unless specifically stated otherwise, the terms "first," "second," "third," and "fourth" are meant solely for purposes of designation and not for order or for limitation.

Reference to "one embodiment," "an embodiment," or an "aspect," means that a particular feature, structure, step, combination or characteristic described in connection with the embodiment or aspect is included in at least one realization of the present invention. Thus, the appearances of the phrases "in one embodiment" or "in an embodiment" in various places throughout this specification are not necessarily all referring to the same embodiment and may apply to multiple embodiments. Furthermore, particular features, structures, or characteristics of the invention may be combined in any suitable manner in one or more embodiments. "Conventional" refers to a term or method designating that which is known and commonly understood in the technology to which this invention relates.

It should be noted that the terms "may," "can," and "might" are used to indicate alternatives and optional features and only should be construed as a limitation when specifically included in the claims of a patent as issued. The various components, features, steps, or embodiments thereof are all "preferred" whether or not it is specifically indicated. Claims not including a specific limitation should not be construed to include that limitation. The term "a" or "an" as used in the claims does not exclude a plurality.

Unless the context requires otherwise, throughout the specification and claims that follow, the term "comprise" and variations thereof, such as, "comprises" and "comprising" are to be construed in an open, inclusive sense—that is in the sense of "including, but not limited to."

The appended claims are not to be interpreted as including means-plus-function limitations, unless a given claim explicitly evokes the means-plus-function clause of 35 USC §112 para (f) by using the phrase "means for" followed by a verb in gerund form.

A "method" as disclosed herein refers to one or more steps or actions for achieving the described end. Unless a specific order of steps or actions is required for proper operation of the embodiment, the order and/or use of specific steps and/or actions may be modified without departing from the scope of the present invention.

DETAILED DESCRIPTION

Figure 1B:
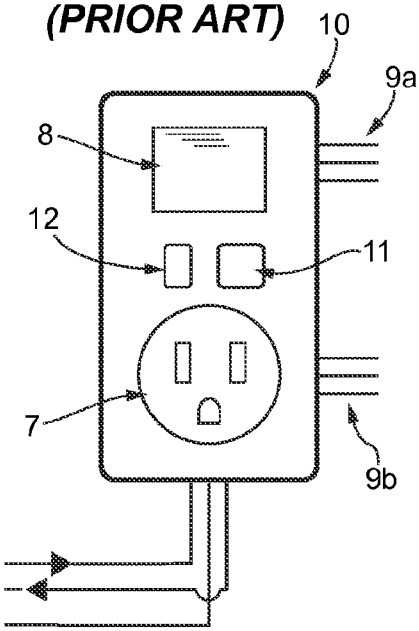
Figure 1C:
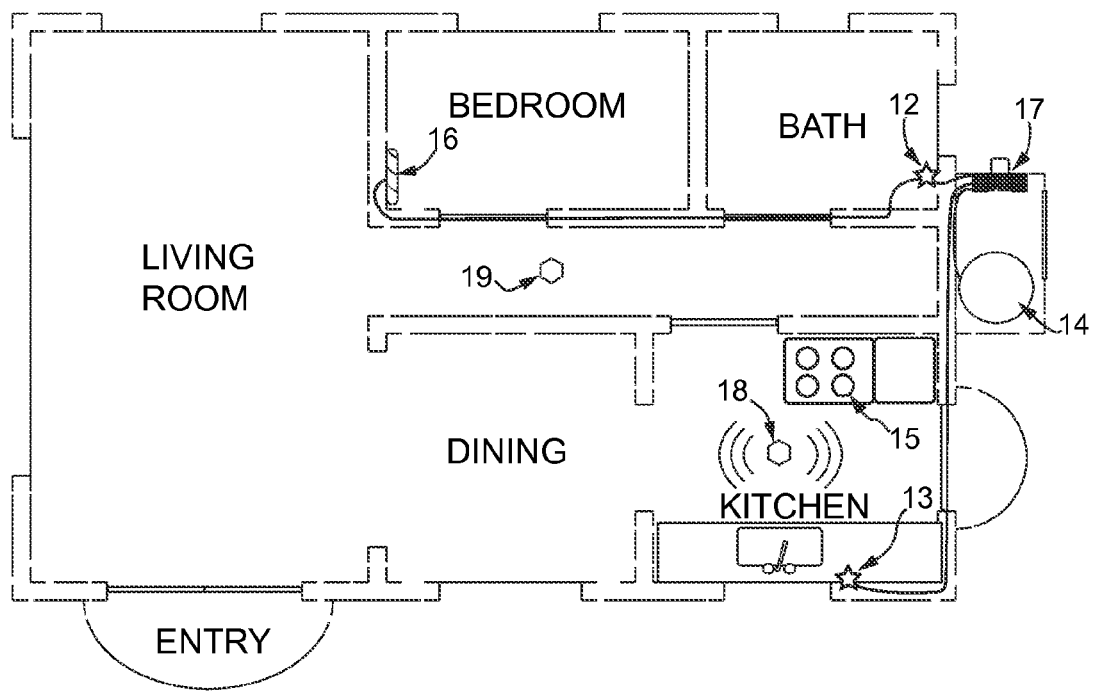

FIGS. 1A, 1B and 1C are views of prior art devices and a context of use. Shown in FIG. 1A is a schematic representation of a conventional GFCI circuit breaker 1, having a relay 2 that is spring loaded and magnetically thrown, a sensing transformer 3, and a circuit board 4 capable of responding to a current from the sensing transformer as known in the art, thereby tripping the relay and cutting power to any downstream devices in series 5. Also shown is a HOT line (power IN), a NEUTRAL line as customary for AC power, and a CHASSIS GROUND, sometimes also referred to as "the ground". FIG. 1B is a front view of a conventional GFCI device 10 having a power feed and ground 6, a receptacle for receiving a plug 7, a rocker switch 8 for operating a slaved circuit, one or more downstream circuits 9a, 9b in series, a reset button 11, and a circuit test button 12. Because the relay 2 is mechanically operated, the relay must be tested frequently to ensure that corrosion has not deteriorated its operation. Once a relay is tripped, it must be manually reset using button 11. These devices are standard in most newer buildings.

FIG. 1C is a view of a household having two GFCI circuits, one (12) in a bathroom and another (13) in a kitchen. Both are near sinks Although the circuits are frequently cited as needed where electricity is used in proximity to water, no GFCI circuit is provided on a hot water tank 14, at major appliances such as a stove 15 and wall heater 16 or at a main fuse box 17. No protection is provided against electrical fires. Smoke alarms 18, 19 have no means for shutting off electrical devices that may be responsible for igniting a fire. Smoke alarm 18 is shown in an alarm condition, with the alarm indicated figuratively here by sound waves emitted from a speaker inside the device, but any hazardous condition must be attended to in person, and a building is at risk if a fire breaks out while the structure is vacant, if an occupant is able to sleep in spite of the sound of the alarm, or if the occupant otherwise fails to or is unable to respond.

Figure 2:
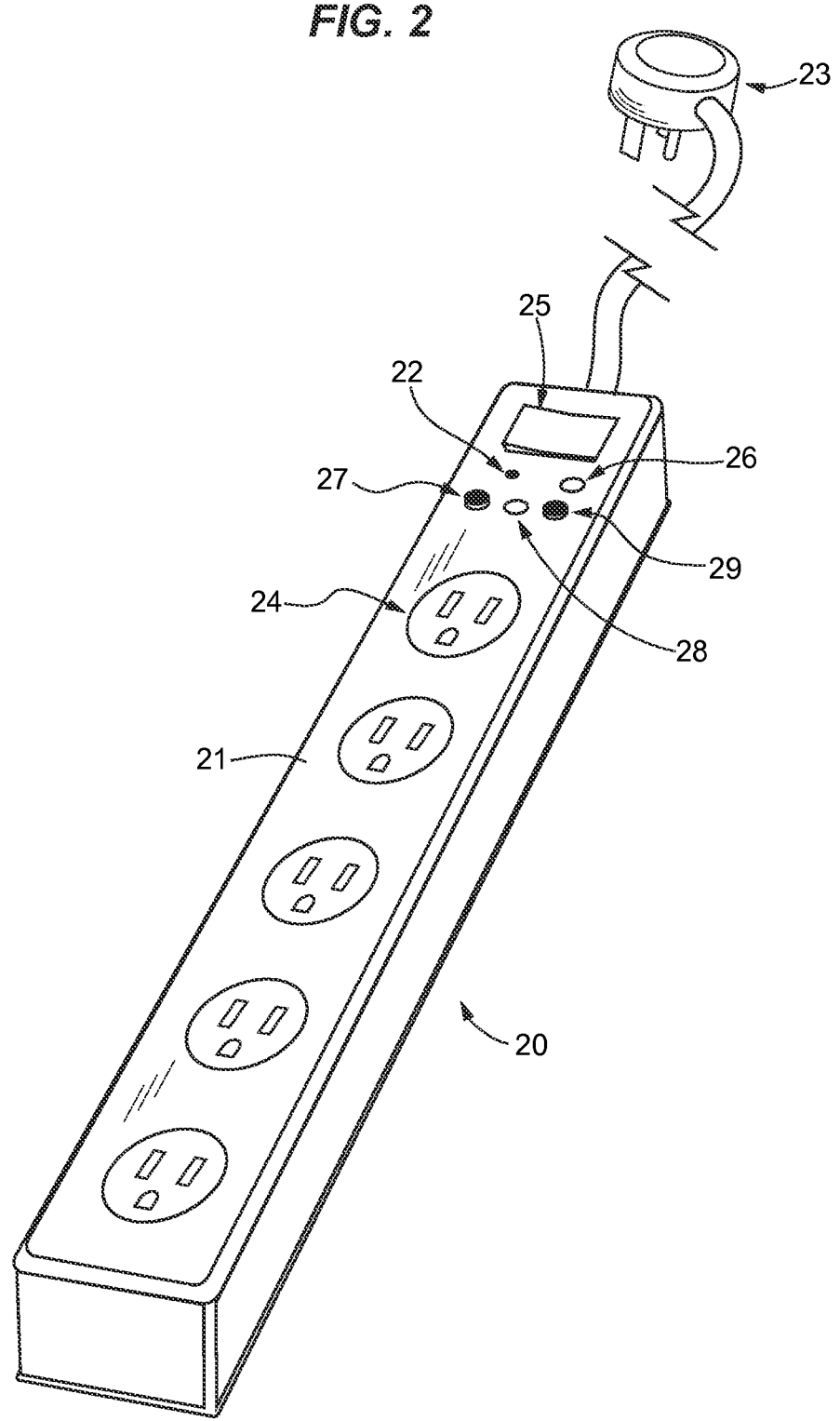
FIG. 2 is an external illustration of a power strip containing a first embodiment of the invention.

Referring now to FIG. 2, there is shown an external illustration of a power strip 20 with signal-activated circuit interrupter. The invention appears much like any power strip with one noticeable difference being an audio alarm receiving port 22 on the housing 21. A "listening port" or an equivalent structure is provided to conduct sound waves associated with an alarm condition into the housing for pickup by a microphone. The invention includes electronic components of a signal-activated circuit interrupter (as described in more detail below), an AC power cord with male plug 23 to receive external AC power, and AC receptacles 24 to provide power to other devices plugged into the invention.

The preferred embodiment of the housing is a metal or plastic box with one or more AC receptacles, (such as NEMA 5-15R) for appliances to plug in and receive AC power. The housing contains a main power ON/OFF switch 25 to manually connect or disconnect power to the entire device, including to the receptacles 24 and thus to any consumer-attached appliances, not shown. Optionally, the housing may contain a main power ON/OFF indicator light emitting diode (26, LED) as a separate component or incorporated into the main power ON/OFF switch. The housing contains a manually operated reset switch 27 as is used to re-enable power to the receptacles after power has been interrupted. A hazard condition indicator LED 28 on the housing can be provided to show the AC power circuit to the receptacles 24 is in a tripped, or open, condition due to detection of a hazard alarm. A hazard alarm test button 29 to emit an audible alarm may be included.

Details of the housing, including any number or variety of brackets, hooks, slots, or mounting holes, or none at all, can be incorporated into the housing 21 and are nonessential to the invention. Similarly, the number or configuration of AC receptacles 24 may be varied according to need.

A manufacturer of the device may choose to include or not include surge protection, arc fault protection, a main power ON/OFF indicator light 26, a hazard condition indicator 28, or other feature adaptable to a power strip, without departing from the spirit and scope of the invention as claimed. Moreover, the number, type, or configuration of external indicators, buttons, and switches is nonessential to the invention, except that a power strip embodiment will have an ON/OFF switch 25, a reset switch 27, and a microphone in acoustical communication with a remote smoke alarm (or other hazard condition detector).

The device of FIG. 2 also serves as a model for incorporation of signal-activated interrupt circuitry into an internal control circuit of any device being protected. The housing would be specified according to the functions of the device. If for example GFCI functionality or other circuit breaker functionality is incorporated into the internal workings of the device, then such devices would not require a GFCI-equipped power outlet. Industry producers may choose to incorporate signal-activated interrupt circuitry of the invention (such as shown in FIGS. 6A-6B) into the internal power supply circuit of an appliance being protected. In other embodiments, the circuitry may be incorporated into an AC outlet. In yet another embodiment, as described in FIGS. 4-5, an adaptor may be plugged into a GFCI outlet, the adaptor having the capability to trip the circuit breaker when activated by an audio alarm.

Figure 3:
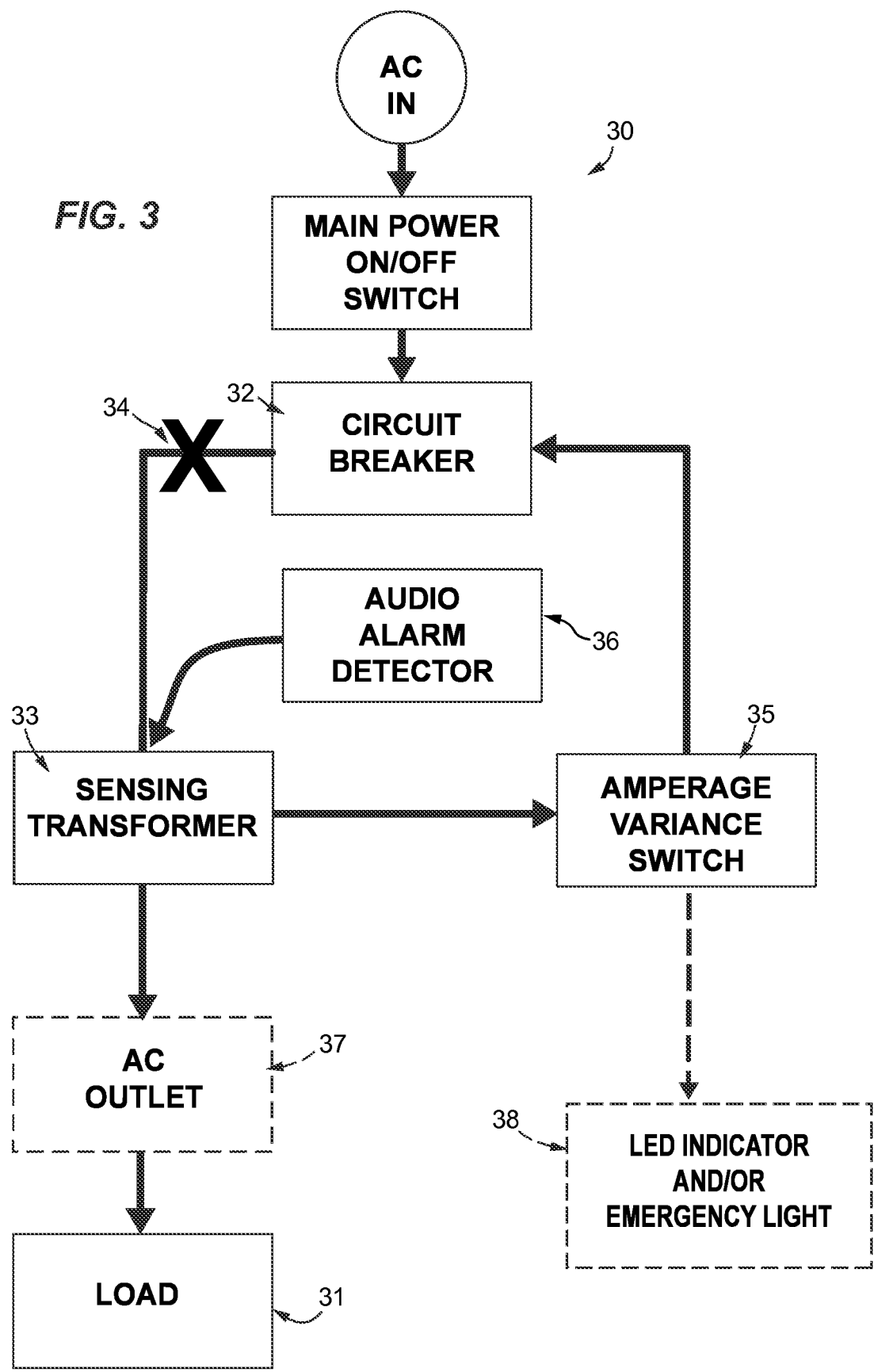
FIG. 3 is a block diagram depicting the operation of a signal-activated circuit interrupter apparatus of the invention.

FIG. 3 is a block diagram depicting the operation of a signal-activated circuit interrupter apparatus of the invention. Shown is a power supply 30 with AC IN for supplying power to a load 31, the power supply having a circuit breaker, solenoid or relay 32 with sensing transformer 33 as found in GFCI circuits. The circuit breaker is generally a conventional magnetically thrown relay, but may also be an AC Triode, an AC power MOSFET, a thyristor, or an SCR, for example, and cuts power to the load as indicated by an X (34). When the sensing transformer detects a current imbalance, a switching circuit 35 sends a signal to the circuit breaker that interrupts the power. The current imbalance in some instances may be the result of a ground fault, but in other instances may be caused by a trigger signal output from the audio alarm detector circuitry 36.

As disclosed here, hazard conditions other than ground leak may be used to cut power to a load. Hazard detectors may be operated remotely, and a hazard condition may be communicated by an audio alarm and received by a microphone forming a part of an audio alarm detection subcircuit 36 as a component of a signal-activated circuit interrupter of the invention. The audio alarm detector subcircuit functions as to trip the GFCI breaker 32 by imbalancing current through the sensing transformer. Surprisingly, the ground leakage detector can be "tricked" to detect other hazard conditions. The audio alarm detector subcircuit includes a short-circuit path between the HOT and the GROUND power lines under control of a microphone that detects an audio alarm condition from a remote alarm (such as a smoke alarm). A "trip gate" component of the audio alarm detector is used to controlledly route an effective amount of current through the short circuit path. A triode may be used for this purpose, for example, generally in series with a resistor or snubber to limit the current. Generally a current of about 5 mAmps (or more) for perhaps 6 msec is sufficient to trip a GFCI circuit breaker. Other breakers may have different requirements. The precise current requirement may also be different according to jurisdictions and applications, and may generally be determined by trial and error so as to be reliable and effective. Thus a more accurate description is "an amount of a current effective for tripping a circuit breaker".

The microphone output generally includes a filter for selectively responding to a particular audio frequency and a watchdog subcircuit for authenticating the signal as a valid alarm condition (such as having a sustained duration or a pattern of pulses characteristic of a valid alarm) before tripping the circuit breaker.

Loads 31 that are likely to be associated with fires include those associated with cooking, such as toasters, microwaves, stoves, ovens, and also other ignition sources, such as irons, hair dryers, portable heaters and the like.

In a typical circuit interrupter, input AC IN power is routed through a main power ON/OFF switch and then through a ground fault circuit breaker with sensing transformer, amperage variance switch. A typical off-the-shelf ground fault circuit breaker 32 is suitable if compatible with an audio alarm detector 34 as shown. The sensing transformer output is routed to an amperage variance switch that trips a relay if there is a current imbalance in the hot and neutral current flow, as known in the art. The hazard condition detector acts by diverting current from HOT to GROUND through a short-circuit (in the absence of an external ground fault), thereby causing the amperage variance switch to trip the circuit breaker and cut current to the load. Optionally the load may be connected to the circuit breaker by an AC outlet 37 or other series connection.

An LED 38 warning light to indicate that the circuit has been tripped and/or to provide emergency lighting may also be included if desired. Because the breaker is upstream from the downstream lighting components, these components are powered from reserves in the unit, either a rechargeable battery that is held in a normally fully charged condition, or a capacitor or supercapacitor. The manufacturer may specify a duration of active use following loss of AC power and size the charge reserve components accordingly.

FIG. 4A is a schematic representation of a portable signal-activated circuit interrupter 40 with male electrical prongs (41*a*, 41*b*, 41*c*) for use in the feedback loop power shutoff system of FIG. 4B. In this embodiment, the components of an audio alarm detector and trip gate are packaged as a portable unit 42 and are plugged into any GFCI-equipped power outlet 43 such as a wall outlet or a GFCI power strip having two or more female receptacles (44*a*, 44*b*). The device may be repositioned between different GFCI circuits according to the needs of a consumer. Any GFCI breaker 32 in direct electrical proximity to the portable unit 40 is tripped when a hazard condition is detected. An engineered current leak across a short-circuit path electrical prong 41*c* of the device, from HOT to GROUND, trips the breaker. Current leakage from HOT to GROUND is initiated and controlled by a trip subcircuit 35 or solenoid gate component in response to a trigger associated with hazard condition detection and authentication subcircuitry as described below. The trip subcircuit is part of the amperage variance switch subcircuit 35 as described in FIG. 3 and includes the controllable short-circuit path.

Audio alarm detector 40 is represented as having a sealed housing 42 in FIG. 4B and may be sold as a plug-in unit. The device is compatible with any GFCI-equipped outlet 43 or circuit having a female receptacle 44*a* for receiving the male prongs 41 of the device. The wall outlet 43 is GFCI equipped, and includes standard reset and test buttons (11, 12). Note that when one receptacle of a GFCI wall outlet is tripped, so is the other, so that both receptacles 44*a* and 44*b* are protected by a single GFCI breaker in operative connection with the plug-in audio alarm detection device 40.

Shown here is a power cord with male plug 23 in a top receptacle 44*b* of wall outlet 43 and an open bottom receptacle 44*a*. Dashed lines indicate a plugging action to indicate plugging the male prongs (41*a*, 41*b*, 41*c*) of the device into the female receptacle 44*a*. The power cord is shown to be connected to a load (in this instance a figurative representation of a toaster, 45). The significance of smoke 46 from the toaster will be described below.

By way of example, electrical power supplied to toaster 45 results in smoke. The smoke may presage a cinder that may land on a roll of paper towels near the toaster and hence represents a hazard condition. When the smoke also reaches a kitchen smoke alarm 46, the smoke alarm emits at continuous stream of pulses, three at a time, followed by an interval, as is characteristic of a T3 standard smoke alarm. The signal-activated interrupter circuit inside housing 42 is configured to detect this signal. Audio sound waves from the alarm are picked up by a microphone via listening port 47 in the device housing. LED 48 indicates that the device is powered up and functioning normally. LED 49 indicates that the device has detected a hazard condition and has disabled wall outlet 43.

Thus a "FEEDBACK LOOP" is formed to cut off power to the toaster before a fire is started. The exemplary device includes a trip gate switch circuit and a short circuit path between the HOT and GROUND prongs of the male plug that is detected as a current imbalance by a sensing transformer. The alarm signal from the smoke alarm speaker is detected by a microphone inside housing 42 and actuates the trip gate so that about 5 mAmps is leaked across the short-circuit path. This current imbalance triggers a signal to the GFCI breaker of wall outlet 43 and the circuit breaker is tripped, cutting off power to receptacles (44*a*, 44*b*) and to any load 45 on power cord 23. The "X" indicates that power to load 45 has been cut off. A GFCI breaker in the wall outlet was tripped by a current short circuit of about 5 mAmps from the HOT line to the GROUND, the 5 mAmps bypassing the sensing transformer. Essentially, the current pulse is delivered from prong 41*a* to prong 41*c* (for example, when in electrical contact with the mating contacts of receptacle 44*a*), and the short is then picked up by sensing transformer as previously described. This is an advance in the art, permitting a plug in adaptor to control the operation of a GFCI breaker so as to disable power to downstream appliances when a hazard condition develops. Advantageously, the plug-in device 42 does not cover the GFCI reset or test button (11, 12). By plugging the device 42 into a power strip, where the power strip is plugged into a GFCI outlet, or a power strip which contains a GFCI breaker internally, the same effect can be achieved. A pulse of current shorted across the HOT to GROUND is sensed by the sensing transformer 33 and a signal from an amperage variance switch results in an immediate power cutoff at the GFCI circuit breaker 32.

Figure 5A:
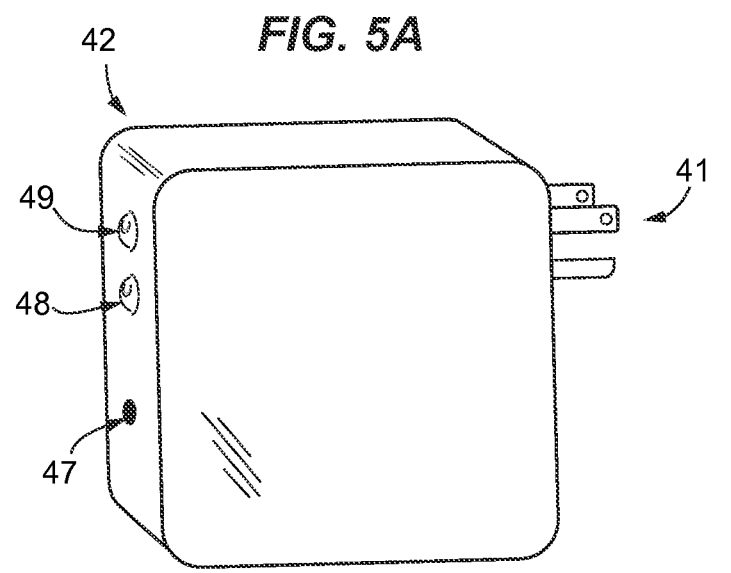
FIGS. 5A and 5B are views of a plug-in acoustic alarm detector device of the invention.
Figure 5B:
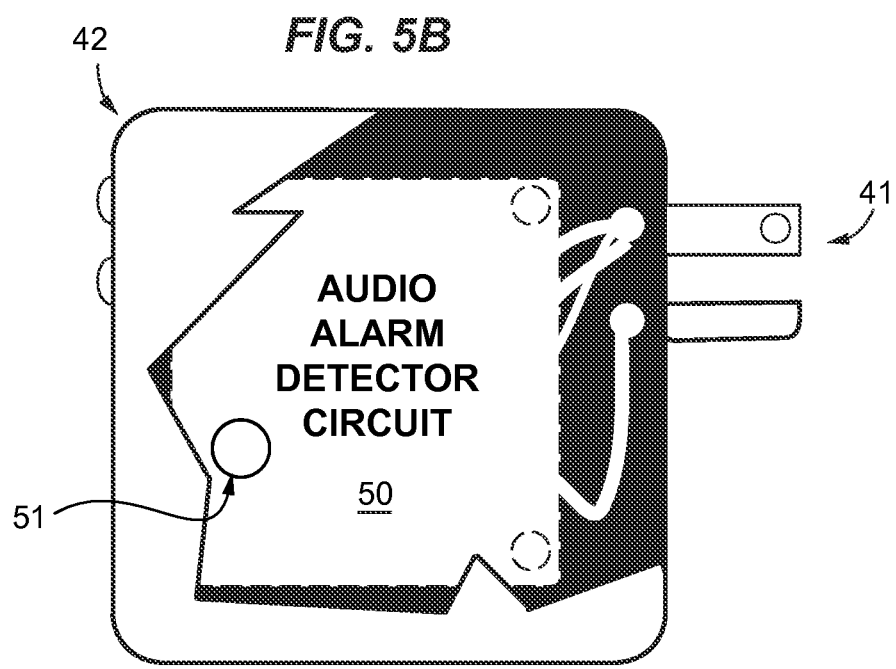
Figure 6A:
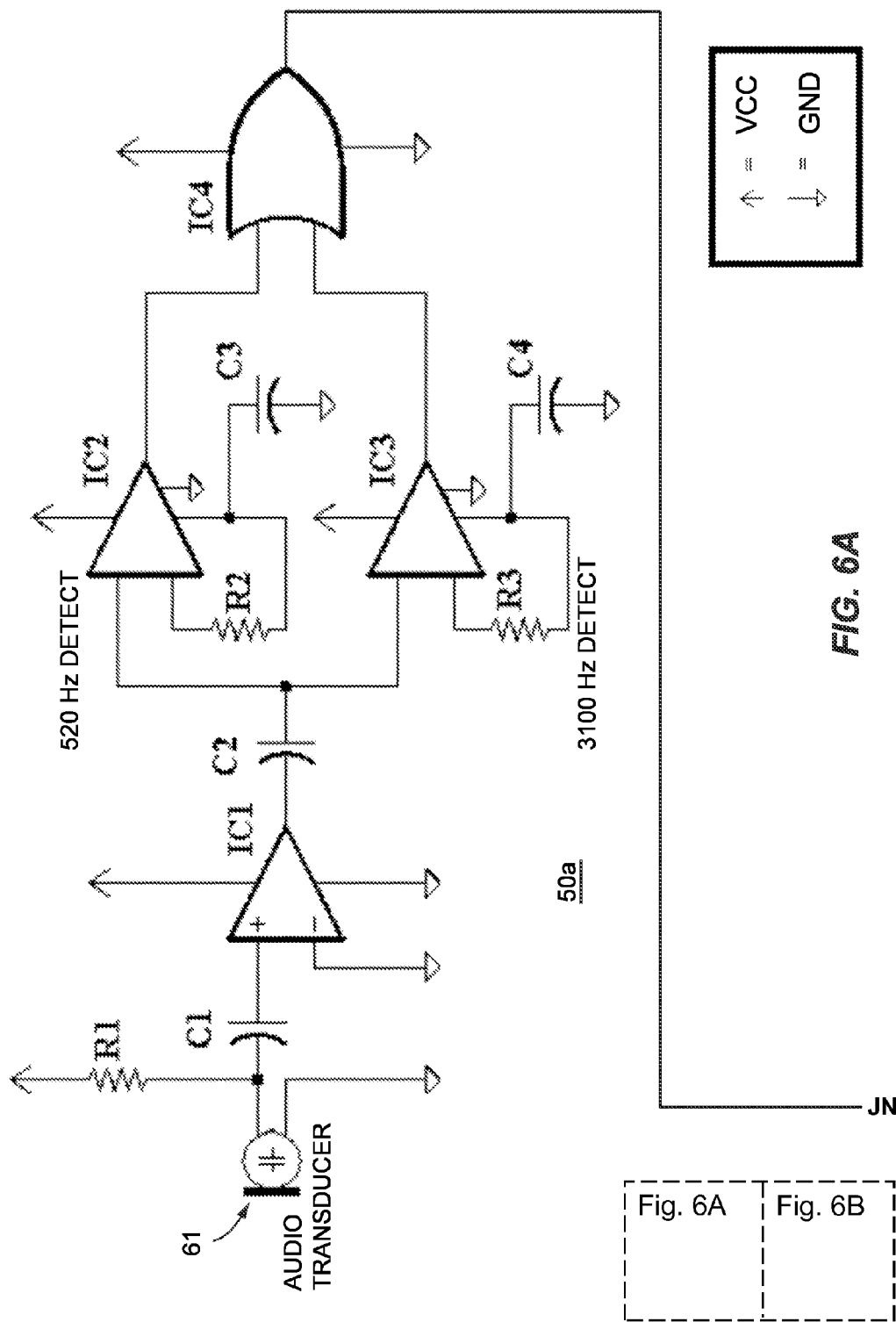
FIGS. 6A and 6B are composite views of a circuit functioning as an acoustic alarm detector device. When used in conjunction with a ground fault circuit interrupt (shown here as GFCI OUTLET, 69), the circuit functions to detect at least one hazard condition as part of a signal-activated circuit interrupter apparatus.
Figure 6B:
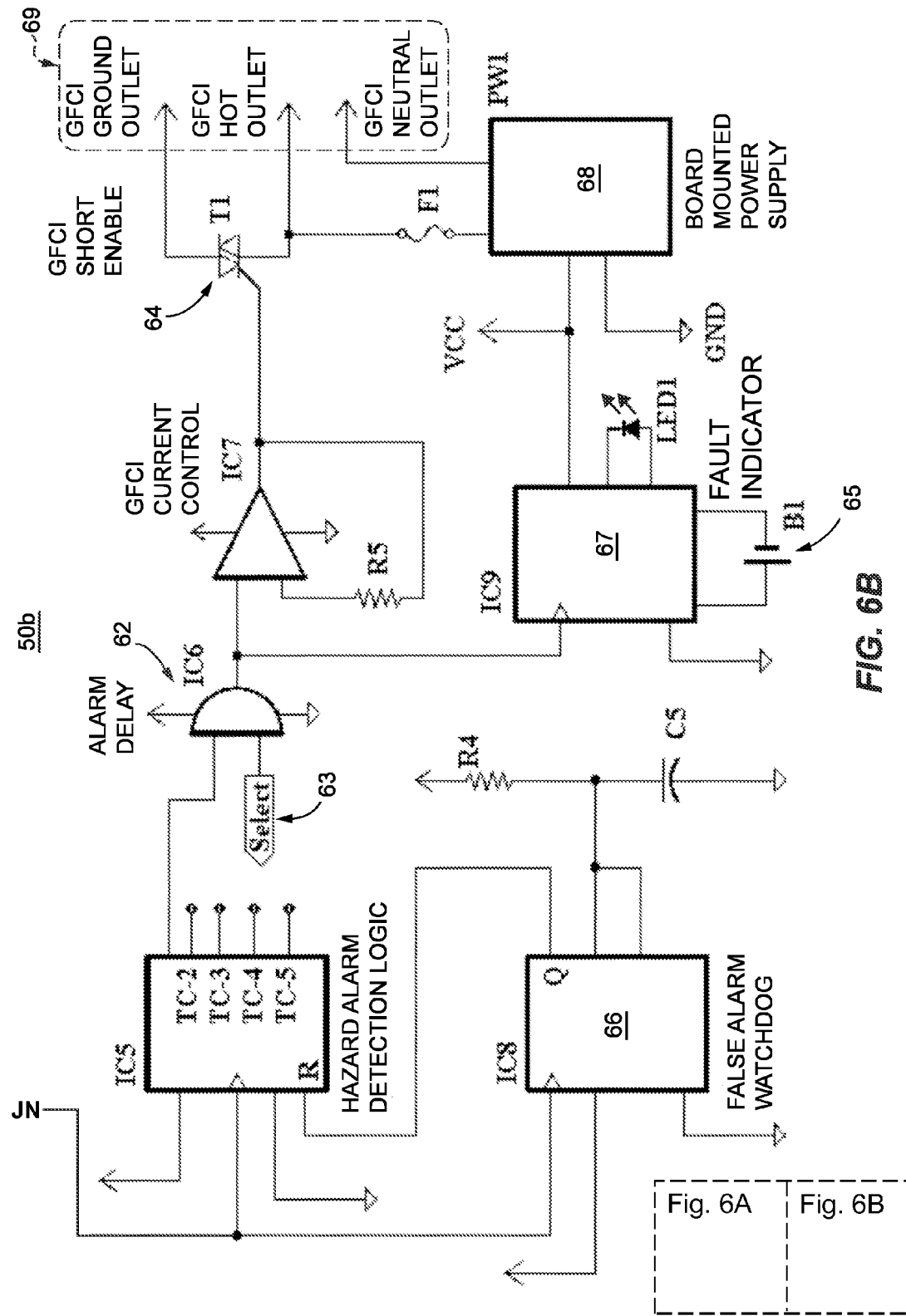

Referring to FIGS. 5A and 5B, and to FIGS. 6A and 6B, more details of an exemplary audio alarm detector circuit are disclosed. When used in conjunction with a GFCI circuit breaker, either within the device or in an external outlet, power strip or appliance, the combination constitutes a signal-activated circuit interrupter device and may be used to detect and cut power in a variety of hazard conditions. For illustration, use in conjunction with an audio smoke alarm is described in more detail.

FIG. 5A is a general view of a device 42 containing an audio alarm detector circuit 50 as shown in FIG. 5B, where the circuit is depicted figuratively as a printed circuit board 50 with an on-board microphone pickup 51 and connections to the prongs of a male connector 41. Shown in FIG. 5A is a perspective view external illustration of a portable casing 42 of the device. The casing dimensions are not critical except that it must hold all the required components and not obstruct adjacent receptacles when plugged into an AC outlet or power strip. FIG. 5A shows a typical placement of the standard three-prong plug 41, which includes hot, neutral, and ground prongs. The main power ON indicator LED 48 and audio alarm receiving port 47 are best located on an exposed face of the casing; i.e., on the surface opposite from the standard three-prong plug. This arrangement facilitates visual inspection of the main power ON indicator LED 48 by the user and unobstructed reception of alarm signals into the audio alarm receiving port 47. The audio alarm receiving port allows sound waves associated with hazard alarm signals into the enclosure for detection by a microphone associated with hazard alarm detector components 50, not shown. The main power ON indicator LED 48 simply indicates that AC power is being supplied to the unit through the standard three-prong plug 41 and a no-light condition means the unit is either not plugged in or no power is available at the receptacle. Turning the unit on or off is accomplished by the user manually plugging or unplugging the unit from an AC power source, not shown. The invention may be tested by the consumer manually activating test button 12; (or optionally the test button on a smoke detector so as to verify that the entire feedback loop is operative), and verifying that the main power ON indicator LED 47 turns off and AC power is not available to the targeted appliances. A "hazard detected" LED 49 may also be supplied to aid in separate verification of the audio alarm detector subcircuit if desired. The invention is reset by the consumer manually pressing the GFCI's reset button (11) on the affected power strip, wall outlet, or electrical panel, thus restoring power.

The advantages of the portable GFCI embodiment of the invention include, without limitation, it is simple to install and operate, it is portable, it only operates on the appliances the user chooses to plug into its receptacles, it does not hide or obstruct wall outlets, it does not interfere with existing features of the AC power source outlet, it responds to all audible hazard alarm signals that match its definitions, and the user can plainly see and test all of the appliances plugged into the device. In the event of smoke or fire, the unit acts as part of a feedback loop, disabling power to any devices in series with the GFCI outlet or power strip, essentially as shown in FIG. 3 schematically and FIG. 4B more figuratively.

FIGS. 6A and 6B are composite views of an electrical circuit 50 functioning as an audio alarm detection circuit (AADC) and as a signal-activated circuit interrupter (SACI) when used in conjunction with a ground fault circuit interrupter (GFCI) connected at outlet 69.

Briefly, the hazard alarm detector components draw AC power from the primary circuit. DC voltage is supplied to DC components of the circuit. Hazard alarm detector 50 components include a microphone and printed circuit board with functional components for digitally recognizing and responding to a validated alarm condition detected by the microphone. In the case of a smoke alarm, the components are configured to detect a "Temporal 3" (also known as "T3") audio smoke alarm signal (a distinct pulsatile signal pattern described in ANSI standard 53.42 1990) at 3100 Hz and/or 520 Hz. Any microphonic signal that passes through initial filtering is evaluated for its pulsatility and duration and if authenticated, a trip signal or "trigger" is output to a "trip subcircuit" that controlledly releases short-circuit current in an amount sufficient to trip a GFCI breaker device (connected to outlet 69) in electrical contact with and in proximity to circuit 50.

Where a sensor transformer is contained in a wall outlet into which the device is plugged, or is contained in the immediate device itself, the sensor transformer output results in tripping of an associated GFCI circuit breaker. Once power to the wall outlet or device is terminated, the hazard alarm detector loses main power and the primary circuitry is restored to operation only when the GFCI circuit is reset.

Figure 7:
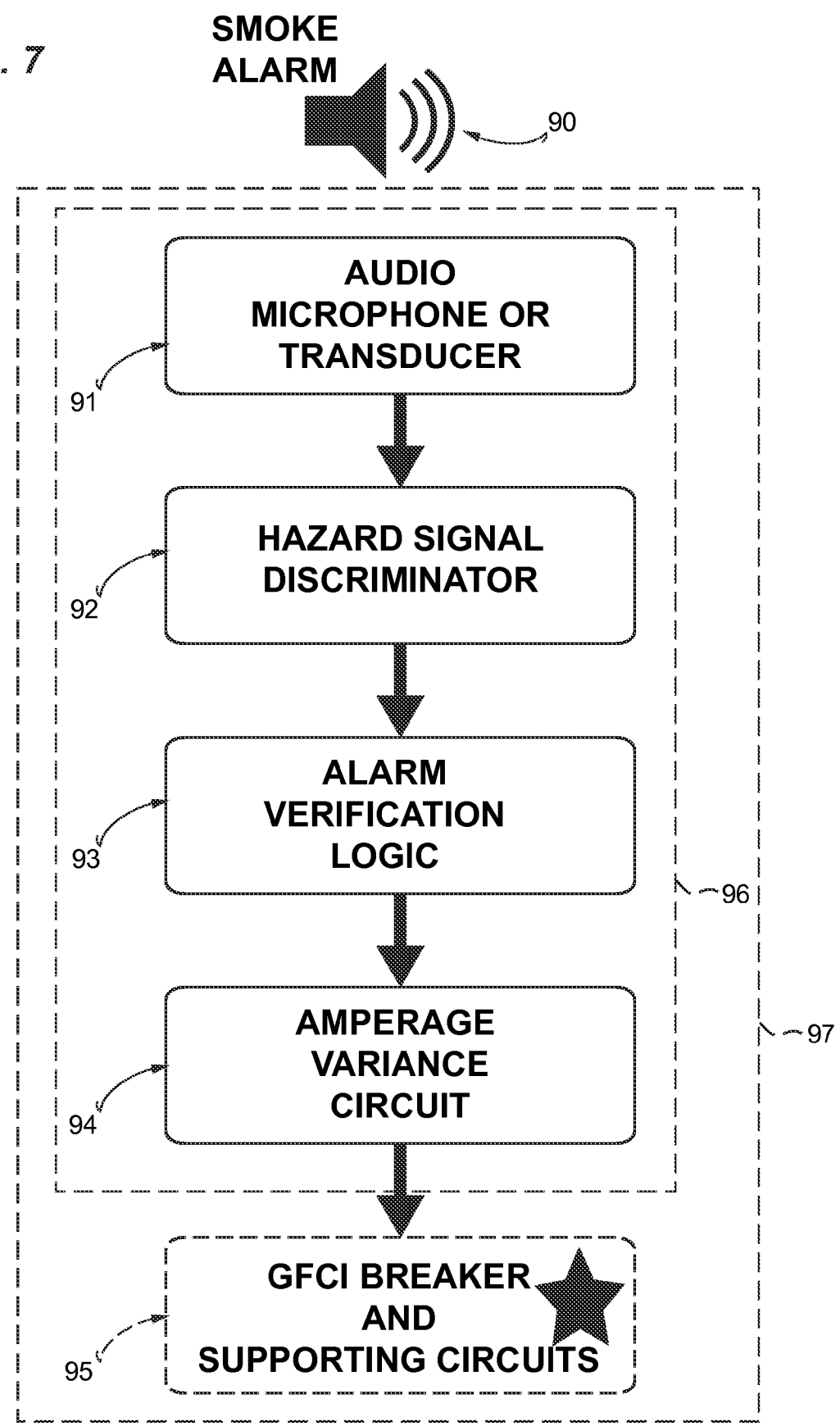
FIG. 7 is a schematic view of the electrical operation of a signal-activated circuit interrupter apparatus with GFCI breaker.
Figure 10:
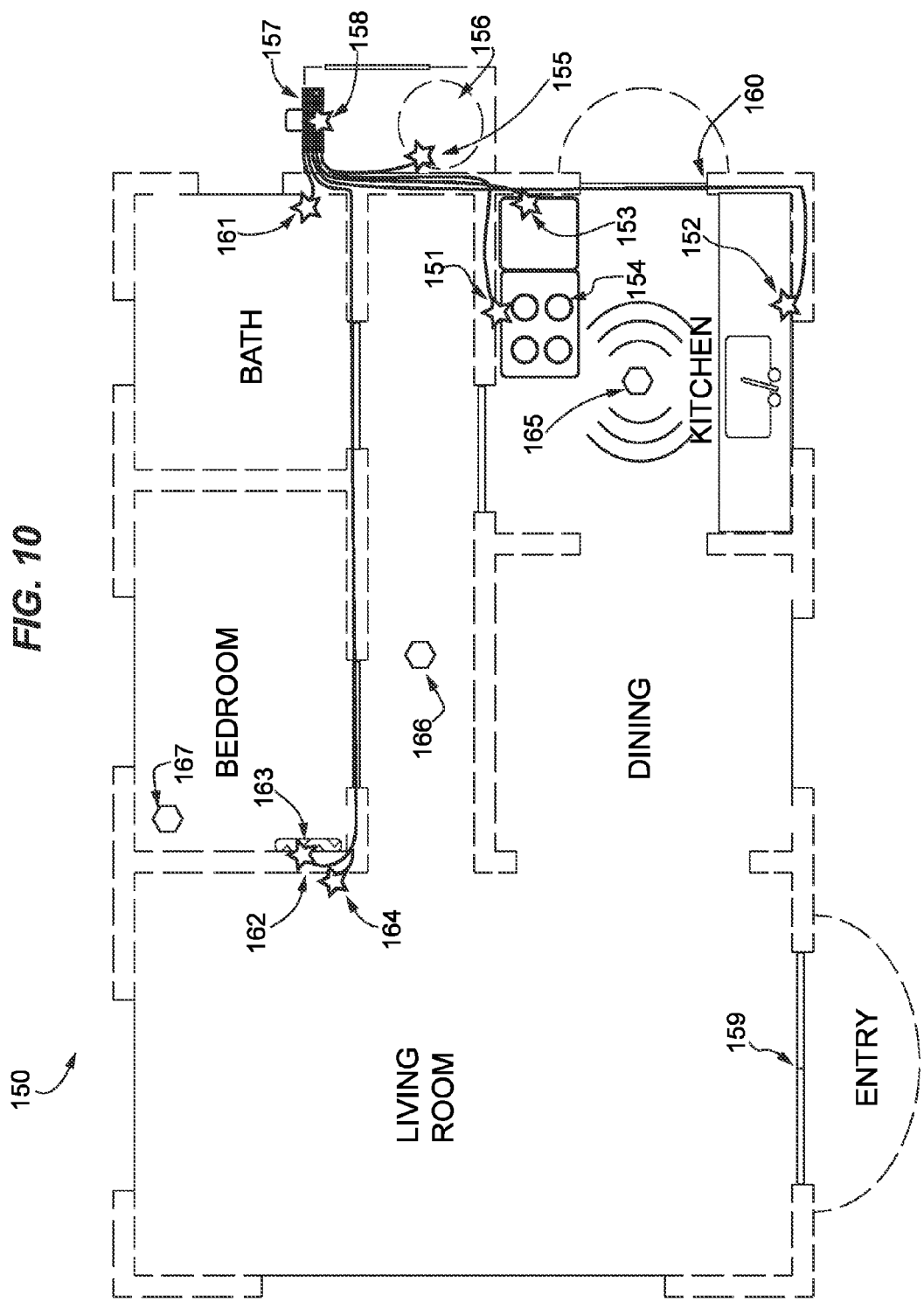
FIG. 10 illustrates multiple devices of the invention (starred) in a context of use.
Figure 11:
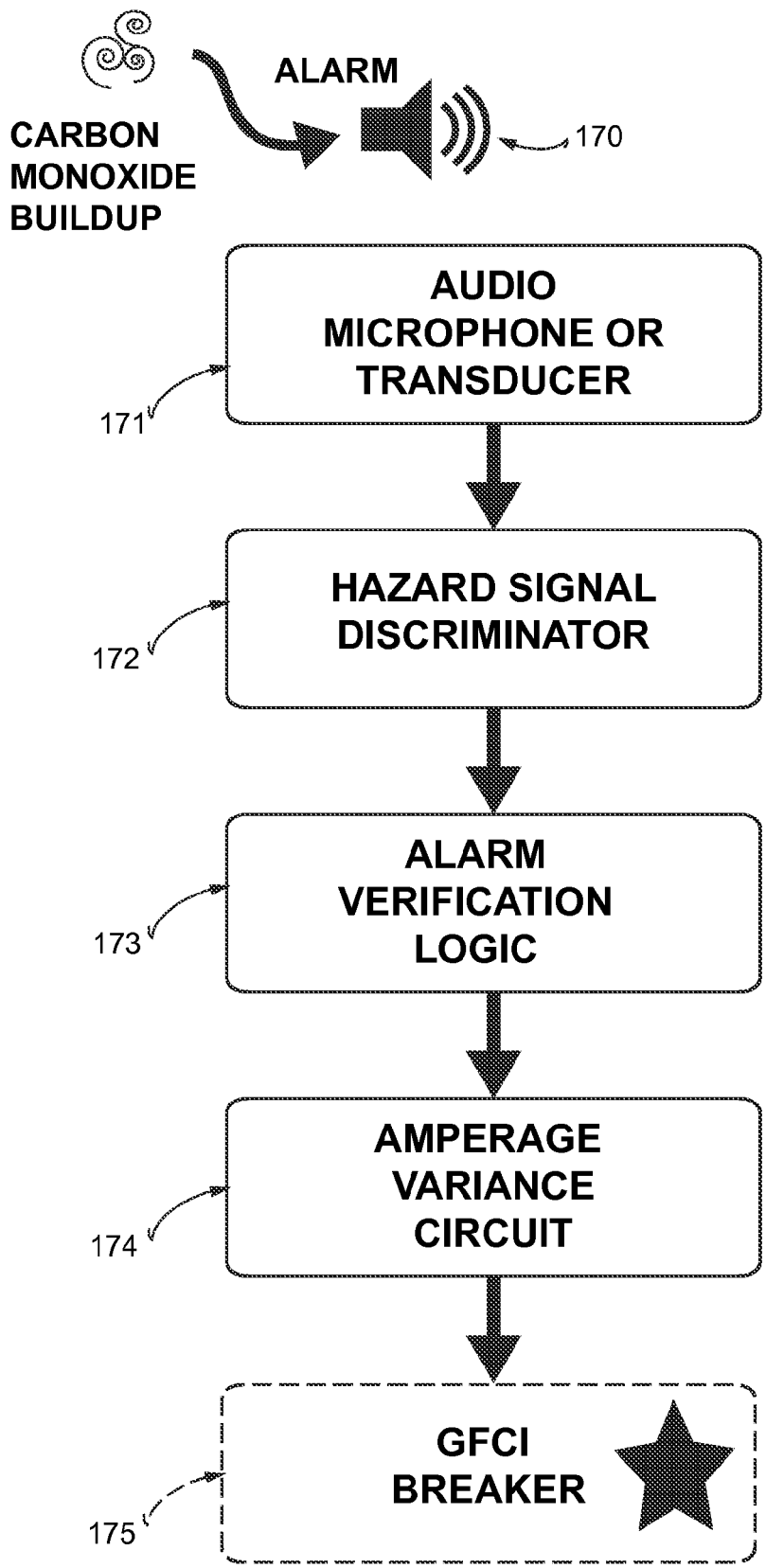
FIG. 11 is a schematic view of a signal-activated circuit interrupter for use with a T4 carbon monoxide detector and alarm system.
Figure 12:
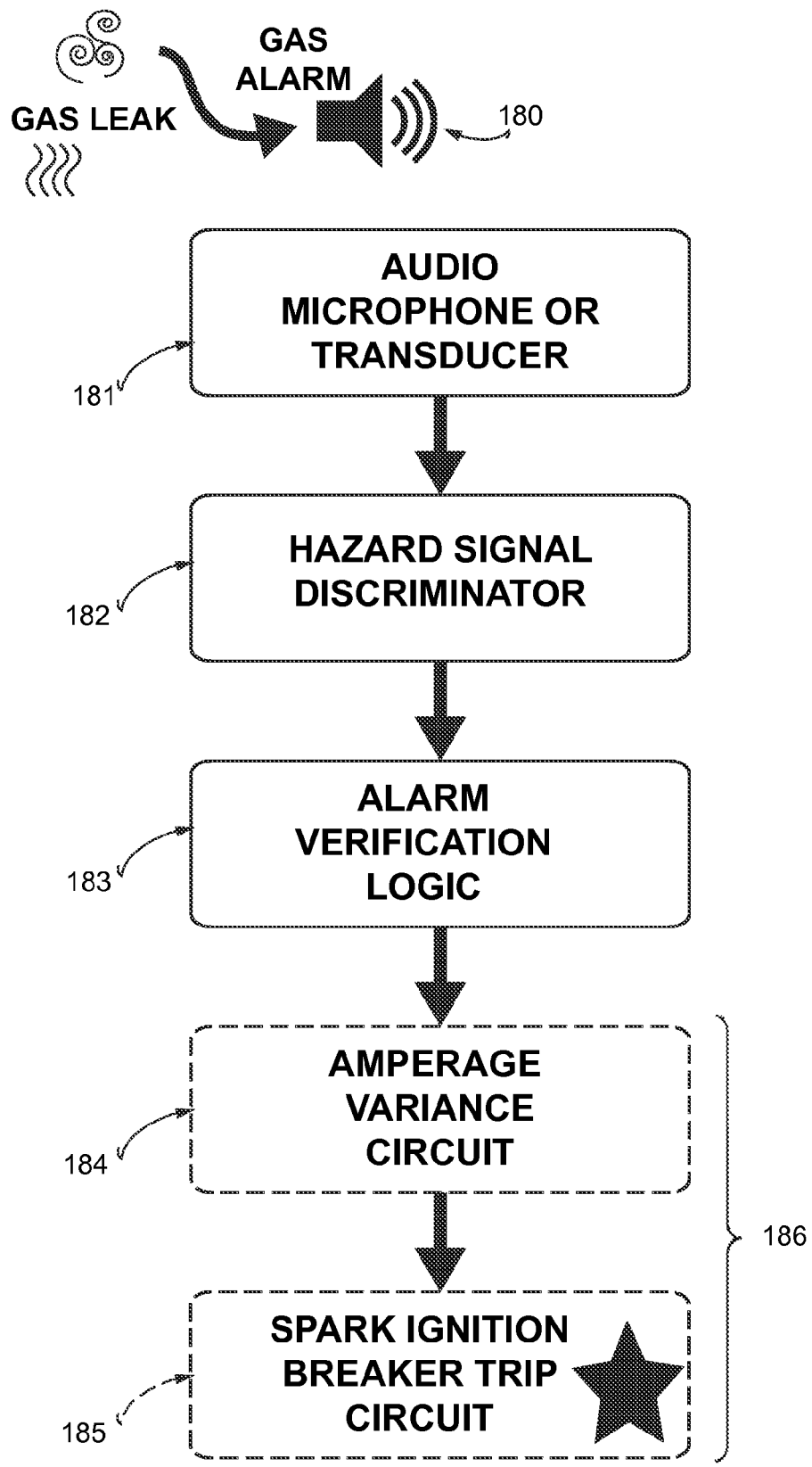
FIG. 12 is a schematic view of a signal-activated circuit interrupter for use with a natural gas detector and alarm system where the system is directed at preventing spark ignition.
Figure 13:
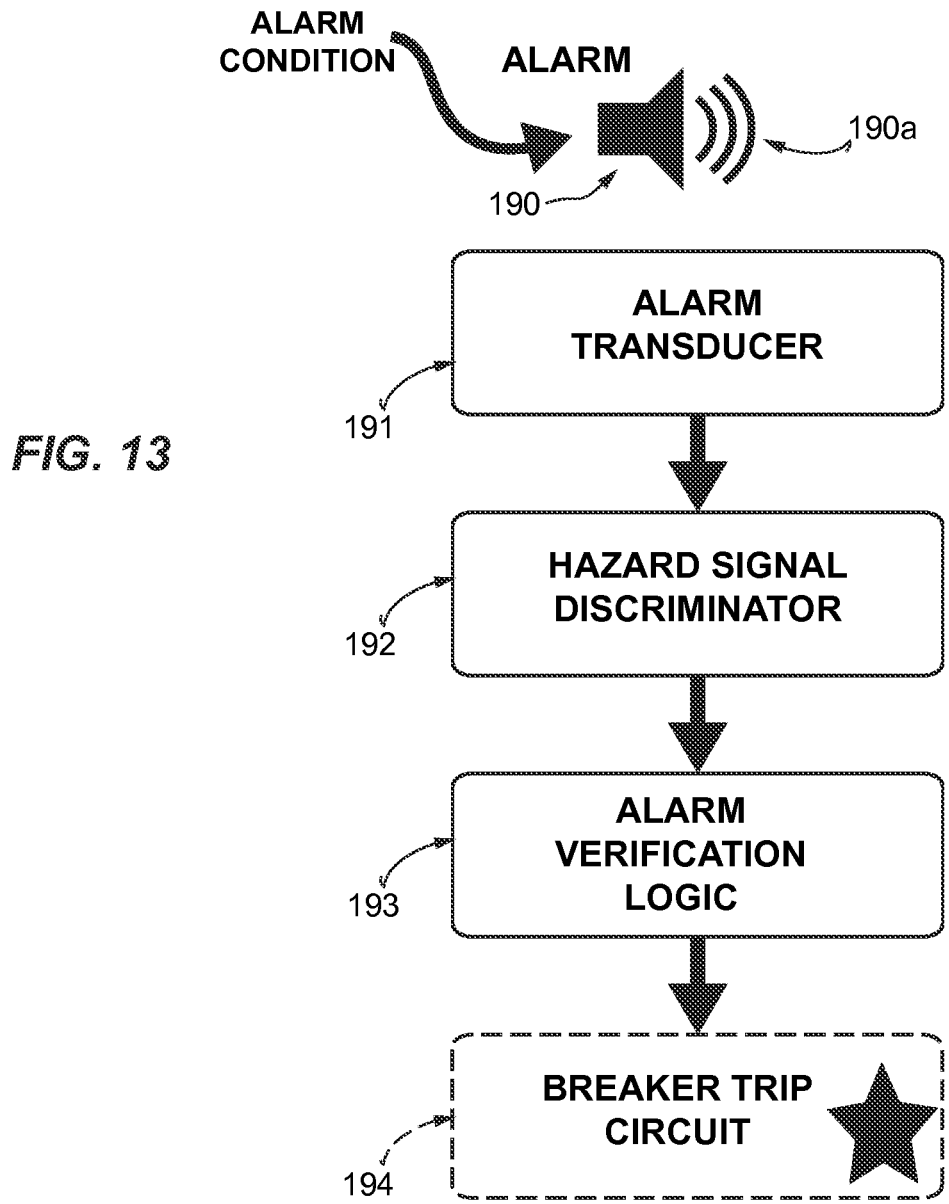
FIG. 13 is a generalized case, showing an alarm system for cutoff of power in response to an alarm condition, where power cutoff is mediated by a signal-activated circuit interrupter with amperage variance circuit.
Figure 14:
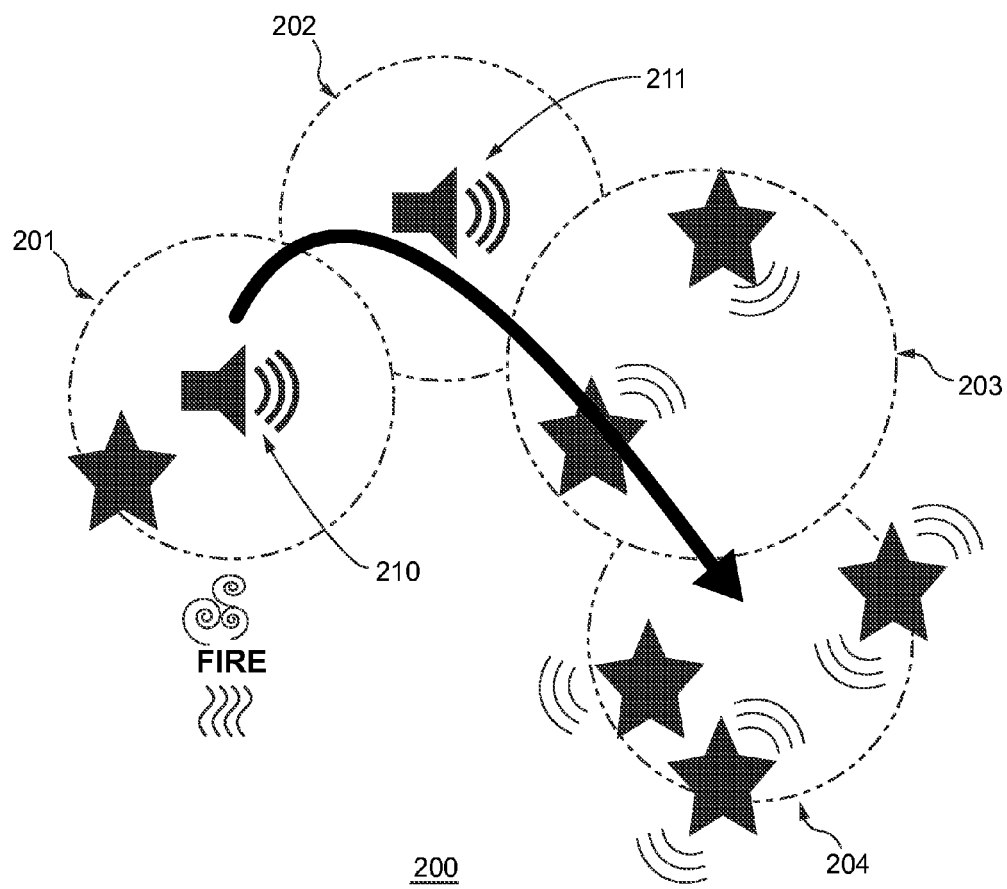
FIG. 14 is a view of a network of signal-activated circuit interrupters and smoke alarms.

In more detail, the components of an exemplary circuit board 50 of the invention include a microphone 51, also termed an audio transducer, for generating an analog signal indicative of a hazard alarm condition. The components and functionality of the circuit may then be described as follows:

1. The Audio Transducer (shown here as a condenser microphone 61) receives the tone of the Hazard Alarm from a hazard alarm condition speaker (shown for example as 18: FIG. 1; 46: FIG. 4B; 90: FIG. 7; 110, FIGS. 8B and 9; 165, 166, 167: FIG. 10; 170: FIG. 11; 180: FIG. 12; 190: FIG. 13; and 210, 211: FIG. 14) and passes the signal through C1.
2. Resistor R1 supplies bias voltage for the Audio Transducer.
3. The signal from the Audio Transducer passed through C1 is then amplified by IC1. This signal is also limited to provide the tone detection circuits a stable and consistent level of voltage. Amplification of the audio input will provide a sufficient signal to the tone detection circuits when the Hazard Alarm is a distance away. The limiting of the output will prevent 'clipping' of the amplified output if the Hazard Alarm is in close proximity and the input signal is quite strong.
4. The output of IC1 is passed through C2 to the inputs of IC2 and IC3. IC2 and IC3 are tone detection circuits designed to respond to a specific frequency. The R2/C3 and R3/C4 pair in each tone circuit sets the PLL for the desired tone to be detected. Each tone detector is tuned for the industry standards for Hazard Alarm output tones of 520 Hz or 3100 Hz respectively. When a tone is detected in either of the circuits the respective output is driven high to indicate that it has a matching tone to its programmed input. The bandwidth of each of the tone detection circuits is sufficient to allow for variations in manufacturing of various Hazard Alarm devices. As shown, these circuits may for example function as phase locked loop subcircuits to pass and amplify signals with a specific bandwidth. Other filter components are known in the art and may be substituted to achieve an equivalent bandpass selectivity over non-specific noise. Non-specific microphone signals will be rejected.
5. The outputs of IC2 and IC3 are driving the inputs of IC4 (which in this example passes either the 520 Hz or 3100 Hz detected indicator to its output). This allows for industry standard Hazard Alarm tones to be detected within the device. The junction between IC4 and IC5 is indicated by "JN" at the page margin of FIGS. 6A and 6B.
6. The output of IC4 is the main line indicating that a Hazard Tone is being detected. The digital output of IC4 is driving the inputs of IC5 and IC8 simultaneously.

7. The input of IC8 (66) is set by the indication of a Hazard Alarm tone from IC4. The False Alarm Watchdog timer "wait time" is set by the values of R4 and C5. Typically the delay will be around two seconds. If the False Alarm Watchdog reaches its delayed wait time, then the output of the False Alarm Watchdog (Q) sends a RESET signal to the Hazard Alarm Detection Logic (R). The False Alarm Watchdog is in place to ensure the device does not trip if the user is performing a Hazard Alarm test and only one beep or one cycle of the Hazard Alarm occurs, a tone similar the filter detection circuit is erroneously received, or the Hazard Alarm is safely turned off by the user before the programmed alarm delay is reached. The False Alarm Watchdog will automatically reset the device and place it back into its original "listen and respond" state. Similarly, authentic beeps or pulses that are detected are entered in a register, and if the required number of beeps is detected (three followed by a pause for a T3 smoke alarm) then the alarm condition signal is authenticated.

8. The input of IC5 is also received by the indication of a Hazard Alarm tone from IC4. The Hazard Alarm Detection Logic of IC5 determines if the Hazard Alarm tones heard by the device are actually a Hazard Alarm, such as a Smoke Detector or Carbon Monoxide Detector. IC5 is essentially counting the output it receives from IC4 to determine if it is an industry standard T3 from a Smoke Alarm or industry standard T4 from a Carbon Monoxide Detector. The output of the Hazard Alarm Detection Logic from IC5 is such that it will allow for a delay of the actual trip circuit. The "alarm delay" (62) can be set by the user and is connected to the input of the delay logic of IC6. Input "SELECT" (63) determines the nature of the alarm to be detected. This can be a signal from a processor or may be as simple as a dipswitch that is manually set to select a particular alarm type or types.

9. The input to IC6 is connected to the desired output of the Hazard Alarm Detection Logic from IC5. The Select input (63) of IC6 is connected to one of the TC (Temporal Count) outputs of IC5. A TC output of IC5 is a complete T3 temporal pattern of a Smoke Alarm. In one option, no less than two complete T3 cycles will activate the trip circuit.

10. Once the output of IC6 goes high, it is fed into the input of the GFCI Current Control circuit of IC7. The GFCI Current Control circuit drives the TRIAC (64, T1, more generally a Triode for alternating current). The GFCI Current Control of IC7 will control the current to fault the GFCI receptacle the device is plugged in to. The current that T1 uses to fault the GFCI receptacle will be sufficient to trip the GFCI. The output of IC6 also activates the Fault Indicator of IC9 (67). A varistor or snubber circuit may be used to protect a TRIAC from power supply surges if needed.

11. The Fault Indicator circuit of IC9 (67) at works in conjunction with VCC and is provided with a battery backup (65). The Fault Indicator circuit is activated when it receives a signal from IC6 and power from VCC is absent. LED1 will blink when the delay logic of IC6 activates. While VCC is absent due to the trip circuit causing the GFCI outlet 69 to fault, the backup battery B1 (65) will power only the Fault Indicator circuit so LED1 is able to blink after the power is interrupted. When power is restored to the device, the Fault Indicator circuit will sense VCC and the Fault Indicator circuit will reset.

12. PW1 (68) is the Board Mount Power Supply and is a small switching power supply capable of delivering VCC to the device. It is protected by fuse F1 and is generally powered by rectifying and transforming AC power from the GFCI outlet.

Values of resistors, capacitors, battery capacity, and specifications of other components of the circuit are not given because individual values and specifications are decided by the characteristics of the hazard condition to be detected and the response. For example the RC filters for processing an analog signal in the audio transducer subcircuit are dependent on the frequency of the sound wave (as its analog signal) to be admitted. Similarly, while specifics of a circuit are shown, one skilled in the art will recognize that equivalent circuits may be constructed using different components and templates, so that the details of the drawings and the attached description are not limiting, and the invention is defined by a set of claims, not by the particulars of any illustrative embodiments shown in the drawings. Other equivalent circuits will be recognized by those skilled in the art.

For example, in alternate but equivalent embodiments, a custom fully integrated circuit "chip" or "chips" may be used. In a mass produced item, a single chip amplifies the current from the microphone (61, 91, 125a, 171, 181) and executes a program, for example from an EEPROM component having programmable instructions in memory, to determine whether to output the alarm condition as a digital alarm hazard signal. Clocks and timers are also used, as are registers and databus components as needed to realize an operative circuit. Other IC components include gate logic for validating the alarm characteristics as a valid hazard condition and for outputting an authenticated alarm signal to the trip subcircuit, or another circuit interrupter switch. Field programmable gate arrays may also be used where cost is not prohibitive. While a TRIAC is shown for achieving a simulated ground leakage condition of about 5 mAmps, any AC power MOSFET switches such as described in U.S. Pat. No. 5,134,321, SCRs, and thyristors may also be used in combination with suitable capacitors, resistors and bias voltage wiring. More broadly, any electronic gate and pathway for controlledly leaking a current around a sensing transformer may be used provided the current leakage path is configured to generate an imbalance in the current detected by the sensing transformer. Thus the electronic gate and pathway may direct current from the HOT to the HOT or from the NEUTRAL to the NEUTRAL so as to bypass the sensing transformer. Similarly, a secondary pathway may be used that directs current from the HOT to the NEUTRAL (or vice versa) so as to create a controlled current imbalance. The detection of very small currents in this way overcomes any unlikely objections to directing a small and very safe amount of current to GROUND for a few milliseconds.

Devices may be programmable and may include a graphical user interface for selecting user alarm preferences or an EEPROM with program instructions defining alarm types, such as by heuristic signal recognition. Units may be programmed for example by pressing a test button on a smoke alarm so that the signal-activated circuit interrupter (SACI) can "learn" the signal that will activate it. Any suitable memory for storing and executing programmable instructions under control of a processor is acceptable for the practice of the invention. Thus the invention may be realized by circuits employing a combination of hardware and software. Fully analog circuits may also be devised for some applications.

Figure 8A:
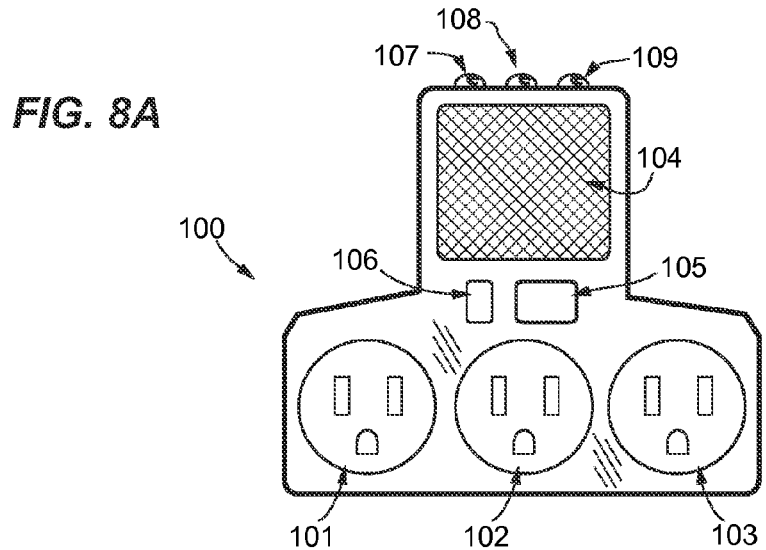
FIG. 8A is a front view of a second portable signal-activated circuit interrupter device of the invention.
Figure 8B:
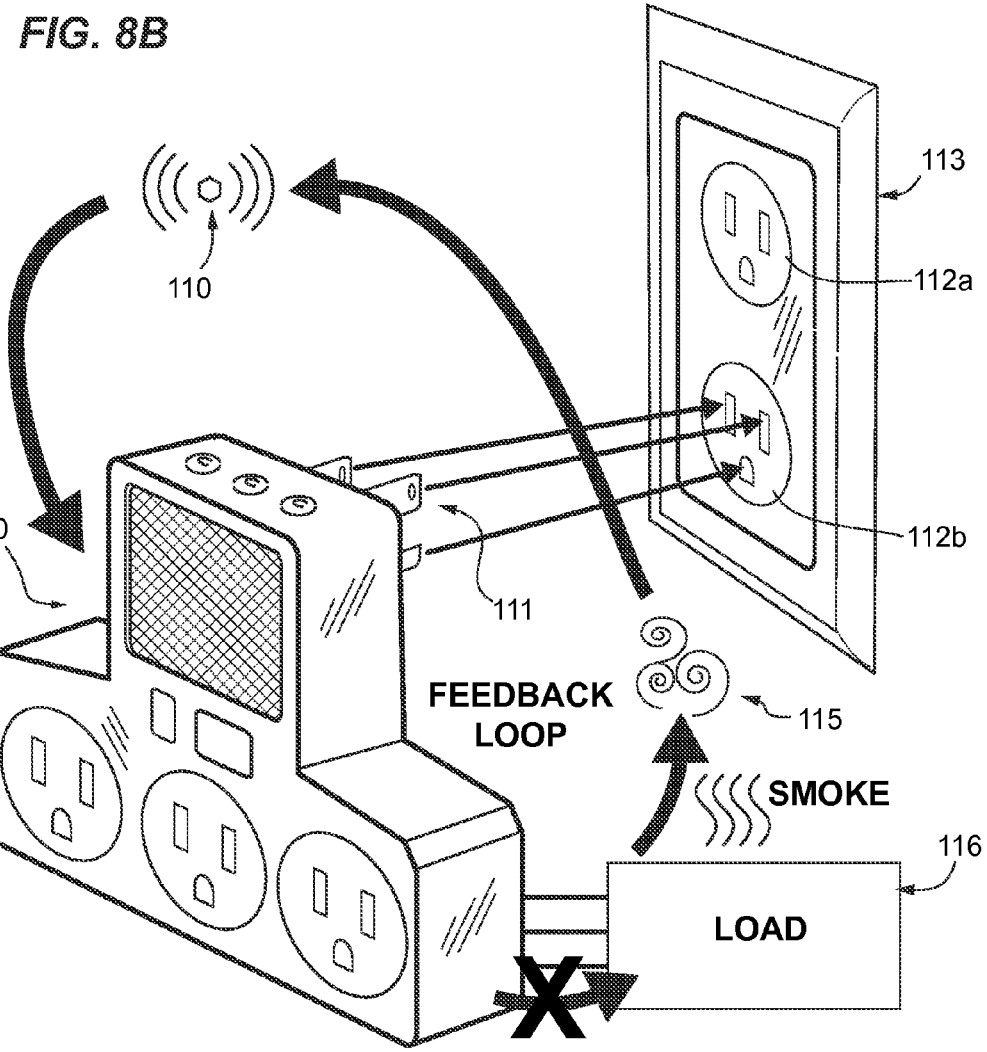
FIG. 8B shows the device in a feedback loop for cutting power to an appliance (load) plugged into the device if smoke is detected by a smoke alarm in proximity to the appliance.

FIG. 7 is a block diagram of the electrical operation of a signal-activated circuit interrupter for tripping a GFCI breaker. The circuit may be considered to perform a series of steps represented here as functional blocks. In a first step, an audio signal from a smoke alarm 90 is received by the microphone 91. A smoke alarm is again chosen for illustration, representing a preferred application, but while not limited thereto. The audio transducer presents an analog output to one or more filters, termed here hazard signal discriminators (92). A signal conforming to one or more industry standards passes through at least one filter and is digitized and analyzed for pulsatility and duration by alarm verification logic (93) used to authenticate the hazard condition. An authenticated output signal is then passed to a trip gate subcircuit (termed here an amperage variance subcircuit, 94). The function of the trip gate when activated is to pass a short current within the device from HOT to GROUND (the diverted current bypassing the sensing transformer), the amount of current being regulated to be effective to trip a proximate GFCI breaker 95. The dashed box surrounding the GFCI breaker circuitry indicates that this functional component may be external to the device. Functional components of the audio alarm detector subcircuit (91, 92, 93, and 94) are generally housed in a single portable device and may share a common housing or circuit board 96. Generally the sensor transformer (with which all GFCI devices are equipped) is used to detect the short, which is sensed as an imbalance in bidirectional current flow through the transformer, resulting in a net current in a secondary coil of the sensing transformer. These GFCI breaker and support functions may be considered as a functional block that is accessory to the operation of the audio alarm detection subcircuit and trip gate functions of device 40 (FIG. 4A), and may be supplied (i) separately as shown in FIG. 4B, where a standard GFCI wall outlet 43 is represented figuratively, or (ii) as an integrated device having an audio alarm detection subcircuit combined with a GFCI breaker subcircuit as shown in FIGS. 8A, 8B and in FIG. 7 (96, 97). Circuit box 96 (dashed line) defines an audio alarm detection subcircuit with trip subcircuit; Circuit 50 (FIG. 5B) also defines an audio alarm detection subcircuit with trip subcircuit; Circuit box 97 (dashed line) defines a signal-actuated GFCI circuit interrupt device having an audio alarm detection subunit with trip subcircuit in combination with a GFCI-type circuit breaker.

Thus, in yet another portable embodiment of the invention, GFCI components may be housed on-board in an integrated device 100 that is sold as a unit and may be plugged into non-GFCI outlets (or power strips). This is illustrated with block diagram in FIG. 7 (dashed box, 97), but is shown more descriptively in FIGS. 8A, 8B and in FIG. 9.

FIG. 8A is a front view of a second portable signal-activated circuit interrupter device of the invention. Unlike the device of FIGS. 4A-5B, this device includes an on-board GFCI circuit breaker and may be used in wall sockets lacking GFCI protection or as part of a network of circuit breakers. Any hazard condition detected by a device of this species will result in loss of power to only those units downstream and in series from the GFCI breaker, i.e., receptacles 101, 102 and 103.

Shown in frontal view is the device 100 with three AC receptacles, a light panel 104, a GFCI reset button 105, a GFCI test button 106, a power status LED 107, a hazard condition LED 108, and a photodiode 109 for controlling the light panel.

The light panel 104 may serve as a nightlight or emergency light, such as under binary OR control of a photocell 109 or a hazard condition flag generated by the audio alarm detector circuitry contained in the device. The light may strobe in an emergency, and may provide a steady glow when used as a nightlight according to simple and/or logic or flip-flops provided in the circuit and under control of the reset button 105 and the photodiode 109 when plugged in to a live receptacle 113. As before, the device circuitry also includes a microphone for detecting an audio hazard alarm condition, in this case from smoke alarm 110. In this instance, the housing opening for the light panel is sufficiently pervious to sound waves so that an audio alarm receiving port is not needed.

Referring now to FIG. 8B, shown is the device in a feedback loop for cutting power to an appliance (load, 116) if smoke 115 is detected by a smoke alarm 110 in proximity to the appliance. An application might include for example in a breakfast nook, where a toaster and a juicer are plugged into the GFCI-controlled receptacles 101 and 102, and receptacle 103 is used for recharging a cellphone. The device itself includes a male plug 111 that is powered from the lower of the two receptacles (112*a*, 112*b*) of wall outlet 113.

The unit thus serves as a key component of a "FEEDBACK LOOP", where smoke 115 emitted by the toaster 116 is detected by the smoke alarm 110, and the alarm broadcast by the smoke alarm trips the GFCI breaker in the plug-in unit 100, shutting off the "toaster" 116 and preventing any further possibility of igniting a fire. The "X" indicates that power to the toaster has been cut off by the portable "plug-in" device. Those skilled in the art will readily understand that a plug and cord is not drawn to the toaster simply to accommodate the dimensions of the page. Thus if the occupant inadvertently leaves the house before turning off the toaster, possible risk of fire is averted. The device is a simple adaptor that can be used with the existing wiring, and ties the smoke alarm to a useful function, an unexpected advance in the art, because the upgrade can be installed without the need for an electrician to mount a new outlet or circuit junction box. Previously unrealized safety performance is achieved synergically using the 5 mAmp sensitivity of a GFCI breaker, well within physiologically safe current levels.

As before, the device operates by generating a current imbalance between the HOT and NEUTRAL that is sensed by a sensing transformer inside the device. However, the internal circuitry of this device may be modified by placing the lighting and indicator array functions in parallel with the GFCI circuit breaker, sensing transformer and receptacles 101, 102, and 103, rather than in series as is conventionally the rule. By this modification, selected device functions remain enabled even after the GFCI breaker has tripped. This is advantageous for example if emergency lighting is needed, a feature not commonly available in residential structures. Power packs or rechargeable batteries may also be supplied as part of the device if the manufacturer's intent is to supply a lighting device that functions during power failures. But by using a LED for lighting that has full AC power, the lighting fixture can be configured to emit a series of pulses or to strobe brightly so that the occupant can better understand the nature of the emergency. Experience has shown that some individuals are dazed by the sound of a fire alarm or even fail to hear the alarm in their sleep, so the use of a visual display adds value to the protection provided by the device. An LED for display of instructions may also be provided when powered by a parallel connection to a live circuit that is wired independently from the circuit breaker or relay.

In this embodiment, the internal GFCI breaker is configured to trip only the outlets 101, 102 and 103 and not the light panel or LED status indicators. As will be described further below, in a surprising development, an on-board accessory speaker and alarm-generating subcircuit may also remain functional and may be used to disseminate a second audio alarm tone in the internal breaker is tripped, a feature that allows the devices of the invention to function in networks so as to better protect occupants against one or more hazards.

Figure 9:
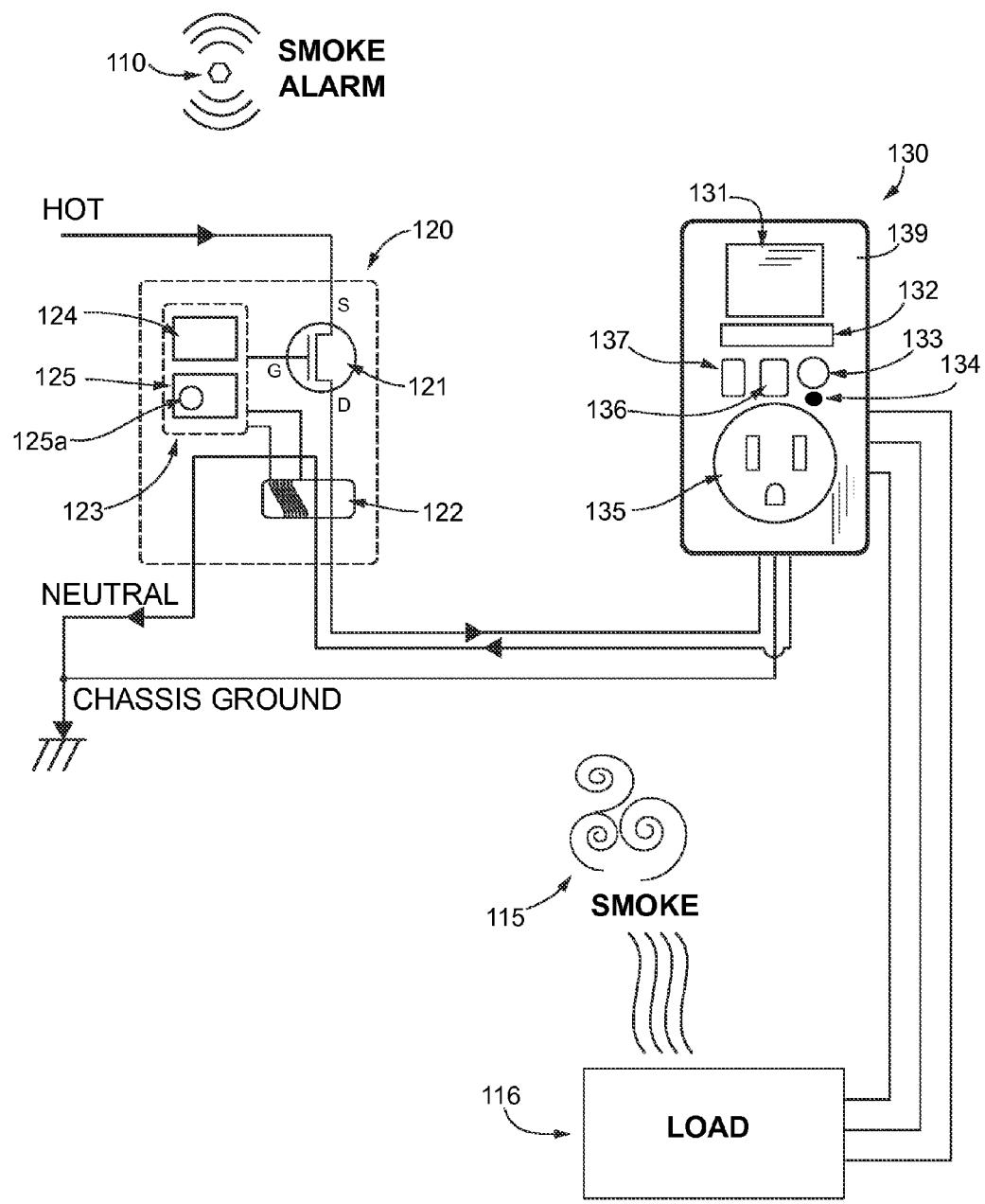
FIG. 9 is a view of signal-activated circuit interrupters of the invention connected in series with a load. Shown are a transistorized circuit breaker as may be employed in fuse boxes and a wall outlet with GFCI. Both circuit interrupters are improved so as to be responsive to ground leakage and to a signal from a smoke alarm.

FIG. 9 is a view of signal-activated circuit interrupters (120, 130) of the invention connected in series with a load. Shown schematically is a transistorized circuit breaker 121 as may be employed in fuse boxes or wall outlets with suitable wiring. Also shown figuratively in front view is a wall outlet 139 with GFCI that has been modified to include an alarm hazard detector circuit inside. The two circuit interrupter schematics (120, 130) are in electrical connection and are improved so as to be responsive to both i) ground leakage and to ii) a signal from a smoke alarm, such as from smoke alarm 110 in response to smoke 115 from our figurative load representing a toaster 116. Because the load is downstream and in series with the two improved devices, an amperage variance circuit or switch of either device, when the GFCI breaker is tripped, will disable power to the load.

Device 120 includes for example a MOSFET AC power transistor 121, a sensing transformer 122, a switching circuit 123 controlling the gate (G) of the power transistor and (i) a first IC (124) for sensing ground leakage and (ii) a second IC (125) for sensing an audio hazard alarm condition as described previously. The second IC includes an on-board microphone 125a. It can be seen that the components for a combined apparatus are capable of acting as a feedback loop for detecting and responding multiple types of hazards. Filter configuration for type of hazard alarm to be detected may be selected with a dip switch for example, or may be controlled by software.

Device 139 includes an outlet, switch, circuit breaker and cover plate. This frontal view shows an illuminated rocker switch 131 for controlling external room lighting, an emergency light, nightlight, or hazard light bar 132, a hazard or power indicator LED 133, an audio alarm receiving port 134 for porting sound into a microphone within the housing, an AC outlet or "receptacle" 135, a standard GFCI reset button 136, and a standard GFCI test button 137. By incorporating a audio alarm detection circuit of the invention (as for example the circuit shown in FIG. 6A-6B), the GFCI may also be tested by actuating the smoke alarm 110. A lamp controlled by rocker switch 131 will begin to blink or strobe if the GFCI breaker is tripped. Thus advantageously, testing the smoke alarm also tests the GFCI circuits equipped with a microphonic alarm hazard detector circuit (50, 50a, 50b).

FIG. 10 illustrates multiple devices of the invention (GFCI breakers are starred) in a context of use, here a household wiring plan 150. Shown are three signal-activated circuit interrupters having GFCI breakers (each equipped with a microphonic alarm hazard detection circuit and a ground fault circuit breaker, 97) in the kitchen, numbered 151, 152, and 153. GFCI breaker 152 is positioned near the sink, GFCI breaker 151 controls the stove 154 and breaker 153 is behind a refrigerator. Not all circuits are necessarily 120 VAC; larger appliances may be controlled by modifying the circuitry to meet the needs of 220 VAC and/or three phase appliance power supplies.

Another GFCI device 155 is associated with a water heater 156. The master fuse box 157 is also equipped with a audio alarm hazard detection circuit and GFCI 158 that may be tripped if hazard conditions within the house escalate. Tripping the MAINS is of importance for example when fire crews must enter a house while protected by spray from hoses, but is a calibrated emergency response controlled by alarm logic circuitry associated with device 158. It should be apparent that the devices function with a network hierarchy in this example. The network controller of device 158 may also be programmed to unlock doors (159, 160) so as to admit emergency personnel by responding to the unique sirens of emergency response vehicles (when alarm authentication logic detects a combination of an internal alarm tone or condition and a proximate external siren) and to help occupants escape or be rescued.

Additional plug in GFCI composite hazard detection units (161, 162, 164) are positioned in the bathroom, in association with a gas wall heater 163 in the bedroom, and in the living room. All units function cooperatively with one or more of the smoke alarms (165, 166) and optionally with a natural gas leak detector 167, for example. Smoke alarm 165 is shown in an active configuration (as represented by sound waves emanating on either side), and is expected to trip breakers 152, 153, and 151, the breakers most likely associated with a kitchen fire. Other configurations will be readily apparent and the wiring diagram and position of signal-activated circuit interrupters may be varied according to needs.

By varying the alarm logic, networks of breakers and sirens may be established, optionally also having strobing lights and indicators that can assist an occupant in identifying the nature of any hazard condition. Loads that are likely to be associated with fires include those associated with cooking, such as toasters, microwaves, stoves, ovens, and also other ignition sources, such as irons, hair dryers, portable heaters and the like. Loads that are associated with spark ignition and are hazardous when exposed to flammable vapors include gas stoves, gas water heaters, and gas wall heaters. Loads that may be associated with carbon monoxide build-up include thermostats operating gas furnaces and the like. A variety of hazards may result in an audible alarm that may be used to trigger power down of a device associated causally and preventatively with the hazard.

Not all alarms detectable by the circuits of the invention are smoke alarms. It will be obvious to those skilled in the art that the hazardous alarm signal detection technology selected is immaterial to the patent. In its preferred third embodiment as described above, the method is detection of audible frequencies with a microphone or audio transducer and amplification and analysis by a circuit such as shown in FIGS. 6A-6B in conjunction with a GFCI breaker or other suitable breaker. The invention may also exploit other technologies, whether in existence and unknown to the inventors at the time of the invention, or those developed or improved in the future, without affecting the novelty of the inventive concepts as defined in the claims. A variety of siren-type hazard alarm detectors such as a "Safety Siren Combustible Gas (Propane Methane) Detector" or a "Safety Siren Combination Gas Detector" are supplied by Family Safety Products (Grandville, Mich.).

FIG. 11 is a block diagram of a signal-activated circuit interrupter for use with a T4 carbon monoxide detector and alarm system. As before, in a first step, an audio signal from a carbon monoxide alarm 170 is received by a microphone or audio transducer 171. The audio transducer presents an analog output to one or more filters, termed here a hazard signal discriminator (172). A signal conforming to one or more industry standards passes through at least one filter and is digitized and analyzed for pulsatility and duration by alarm verification logic (173) used to authenticate the hazard condition. An authenticated output signal is then passed to a trip gate subcircuit (termed here an amperage variance subcircuit, 174). The function of the trip gate when activated is to pass a short current within the device from HOT to GROUND, the amount of current being regulated to be effective to trip a proximate GFCI breaker 175. Carbon monoxide buildup may be associated with defective furnaces, for example, and circuitry of the invention can be used advantageously to shut down or downregulate thermostats that control the defective appliances until corrective action is taken.

FIG. 12 is a block diagram of a signal-activated circuit interrupter for use with a natural gas detector and alarm system where the system is directed at preventing spark ignition. As before, in a first step, an audio signal from a natural gas alarm 180 is received by a microphone or audio transducer 181. The natural gas alarm is preferably sounded at a different frequency than other alarms, and may have a unique pulsatility, requiring modification of the components of circuit 50 for specific detection. However, the functional circuit blocks are inherently similar. The audio transducer presents an analog output to one or more filters, termed here a hazard signal discriminator (182). A signal conforming to one or more industry standards passes through at least one filter and is digitized and analyzed for pulsatility and duration by alarm verification logic (183) used to authenticate the hazard condition. An authenticated output signal is then passed to a trip gate subcircuit (termed here an amperage variance subcircuit, 184). The function of the trip gate when activated is to pass a short current within the device from HOT to GROUND, the amount of current being regulated to be effective to trip a proximate GFCI breaker 185.

While the GFCI breaker combination of the above figures affords an obvious synergy and is readily compatible with existing circuit elements, one skilled in the art will recognize that the authenticated alarm signal may be output to other circuit interrupt components and not limited to GFCI circuit breaking technology. Thus components 186 may be substituted by other circuit breaking elements known in the art as are found to be advantageous, such as for applications in which the alarm detection circuitry is mounted within an appliance by a manufacturer having direct access to the internal power supply and any relays or fuses therein.

In broad embodiment, the present invention is a signal-activated circuit interrupter that allows AC power to flow to one or more outlet receptacles during normal operation, but interrupts the power when an audible or other hazard alarm signal is emitted by a variety of hazardous condition detectors, for example, a smoke detector. The invention can be incorporated into a power strip, a portable casing, or integrated into an appliance's control circuitry.

Alarm conditions that may be associated with audible alarms include a) a smoke alarm; b) a natural gas alarm; c) a carbon monoxide alarm; d) a flammable gas alarm; e) a toxic fumes alarm; f) a motor overload-associated chemical emission (i.e., an odor); g) a ground fault leak alarm; or h) a radon alarm, while not limited thereto. Chemical sensors known for detecting odors are known in the art.

However, GFCI technology presents a surprising and previously unappreciated advantage. While standard breakers are designed to trip at 15 Amps, 20 Amps (or higher), the GFCI sensor transformer is sensitive enough to initiate a trip at only about 5 mAmps. Thus, surprisingly, a digital device that mimics the GFCI trip switch mechanism but couples the trigger to other alarm conditions is an advance in the art and has surprising advantages in cutting power to affected appliances and in reducing potential hazards.

FIG. 13 is a generalized case, showing an alarm system for cutoff of power in response to an alarm condition 190, where power cutoff is mediated by a signal-activated circuit interrupter with a generalized trip circuit. Represented are functional blocks of an alarm transducer 191, a hazard signal discriminator 192, an alarm verification logic 193, and a circuit breaker 194. The alarm condition may be any hazardous condition, and the alarm, while represented here by a speaker 190 such as experienced when a smoke alarm is tested and a high pitched siren sound 190*a* is emitted, is only one of a general class of signals by which an alarm may be transmitted to a circuit designed to detect the alarm. Radio waves for example are well known in the art. Ultrasonics and infrasonics may also be used.

The hazardous alarm signal detection technology selected is only one factor to be considered in designing feedback loops and alarm networks. In the embodiments as described above, the method of detection generally employs frequencies received from an alarm sentinel by a microphone in a signal-activated circuit interruption device, which includes subcircuits for amplification and analysis of the initial signal before responding.

There are synergies in using audible alarms. Building occupants need to know of the hazardous condition. Also, because the audio transducers of the circuit (which are used in circuit testing) may also be used to propagate an initial alarm signal, the devices are advantageously assembled into ad hoc hazard protection networks, such that an alarm in the kitchen may be propagated to an alarm in the bedroom if the hazard level increases, and ultimately can be picked up by a master device in the fuse box, which may perform pre-programmed actions needed to optimize an emergency response such as shutting off ignition sources, unlocking doors or windows of escape routes (when a combination of coded internal alarms are activated), and even using a combination with motion sensors to ensure that the building is vacated, optionally with a capacity to make an emergency call to officials showing the building address, classifying the nature of the hazard condition, and estimating the number of occupants by heat or motion signatures.

FIG. 14 is a view of a network 200 of signal-activated circuit interrupters and smoke alarms. Certain SACIs are equipped with both a microphone and an accessory speaker. In this schematic view, the devices may be capable of both responding to an alarm signal and emitting a secondary alarm signal as a hazard situation escalates. Neighbors, hearing multiple alarms, are more likely to attempt to intervene, any deep sleepers are more likely to be awakened by an alarm signal in the bedroom then one at the other end of a house, and any appliances that are sources of fuel for a fire or for a buildup of carbon monoxide can be shut off while the alarm progresses. A primary audio alarm hazard condition detector unit 210 is indicated as being the starting point of the alarm cascade. It emits an audio alarm. A secondary audio alarm hazard condition detector unit is also shown, which may be activated as the hazard condition expands, such as by spreading smoke. The individual alarm output of the secondary unit, independently or in coordination with the primary alarm signal, initiates a cascade of alarms in individual starred units. Cross-talk may also occur between the starred units having both microphones and speakers, permitting more complex and "smart" interactions in the alarm network.

Coordinated actions to ensure the safety of emergency responders can also be taken. Thus the invention has unexpected properties when used in networks, and the initial realization of its utility may be increased exponentially as multiple such devices are installed and interact. In this view the alarm state propagates through the network by stages (201, 202, 203, 204) as the hazard escalates. A family of specific alarm signatures are known for different types of alarm generation units such as T3 and T4, but advantageously, selected embodiments of the signal-actuated circuit interrupters may also include a speaker having one or more distinct acoustic tones, pulse patterns, or a combination of tones and pulses (S1, S2, S3 . . . $S_n$), that are activated to propagate an alarm condition through a network. By limiting the range or directionality of an audible signal, alarm conditions can be staged or targeted so that the source of the alarm may be quickly located by following the signals, or alarms may be escalated as the alarm condition expands or reaches a pre-set duration without an intervention. In this way, neighbors may be alerted, for example, that a fire is going out of control and the alarm may even be propagated to a neighboring building to alert residents there if there is no intervention at the initial alarm site. The alarm authentication logic thus is programmed or designed to ensure that false alarms are not propagated and that the alarm condition is reset (inactivated) when an effective intervention is detected. Alarm networks may include programmable logic or simple mechanical devices such as dipswitches so that intelligent networks are created by selecting alarm codes that work in a coordinated way to propagate an alarm. In some instances it may be desirable that a kitchen alarm be quickly propagated to a circuit breaker, but if the alarm condition persists, also sent to alarms throughout a building and to remote sites. In some instances, signal-actuated circuit interrupters will include GFCI as a hazard condition, and may propagate a ground fault hazard condition to other units. The source of the alarm may rapidly strobe a hazard-detected LED, whereas other units may have only a slow blink to indicate that the hazard condition is localized in another part of the network. Depending on the time of day, emergency lights may flash or remain on in ways that lead the occupant to the source of the alarm condition.

Signal-actuated circuit interrupters may be classified according to whether the device is repositionable from one load to another load (i.e., is not built in to an appliance) and according to whether device itself includes a GFCI circuit breaker or the GFCI circuit breaker is external to the device. Thus the basic invention may be manifested in a plurality of distinct embodiments. In a first embodiment, the invention is integrated into a power strip and uses its built-in switch to interrupt power to all appliances plugged into its receptacles. In a second embodiment, the invention is integrated into an individual appliance's control circuitry and uses its built-in switch to interrupt power to that one appliance. In a third embodiment, the invention is in a portable casing that can be plugged into a typical GFCI receptacle and interrupts power by tripping off the GFCI. In a fourth embodiment, the invention is integrated into an individual appliance's control circuitry and interrupts power by tripping off the nearest GFCI. The various embodiments may also be incorporated into networks having new and useful properties.

Not all circuit breakers are GFCI circuit breakers. In yet another embodiment, the circuit breaker 194 (FIG. 13) may be a mechanical relay such as Electronic Inc.'s R25-5A16-120 16 Amp 120V AC SPDT relay, but it could be any other type of electronically controlled switch. When the microphone of an application integrated circuit (or field programmable gate array, FPGA) picks up a hazard alarm condition 190a from a speaker 190, it processes the audio signal and sends a hazard-detected signal, or trigger voltage, to the alarm verification logic subcircuit 193, which interrupts the flow of AC power to any downstream AC receptacles or appliances wired in series with the breaker trip circuit 194. However, it can be seen that the GFCI breaker, by virtue of its sensitivity to a mere 5 mAmp current pulse, has an advantage over breakers that trip only when overloaded with larger currents such as 15 Amps or greater.

Elements of conventional arts are incorporated by reference. The Shock Buster GFCI device also has relevant features (U.S. Pat. No. 5,757,598) and is incorporated for all it teaches by reference.

INCORPORATION BY REFERENCE

All of the U.S. Patents, U.S. Patent application publications, U.S. Patent applications, foreign patents, foreign patent applications and non-patent publications referred to in this specification and related filings are incorporated herein by reference in their entirety for all purposes.

SCOPE OF THE CLAIMS

The disclosure set forth herein of certain exemplary embodiments, including all text, drawings, annotations, and graphs, is sufficient to enable one of ordinary skill in the art to practice the invention. Various alternatives, modifications and equivalents are possible, as will readily occur to those skilled in the art in practice of the invention. The inventions, examples, and embodiments described herein are not limited to particularly exemplified materials, methods, and/or structures and various changes may be made in the size, shape, type, number and arrangement of parts described herein. All embodiments, alternatives, modifications and equivalents may be combined to provide further embodiments of the present invention without departing from the true spirit and scope of the invention.

In general, in the following claims, the terms used in the written description should not be construed to limit the claims to specific embodiments described herein for illustration, but should be construed to include all possible embodiments, both specific and generic, along with the full scope of equivalents to which such claims are entitled. Accordingly, the claims are not limited in haec verba by the disclosure.

REFERENCE NUMBERS OF THE DRAWINGS

1 Circuit breaker assembly with GFCI ground leak protection
2 Relay
3 Sensing Transformer
4 GFCI circuit board
5 HOT, NEUTRAL and GROUND lines OUT
6 HOT, NEUTRAL and GROUND lines IN
7 Female plug receptacle
8 Rocker switch
9a First power supply outlet
9b Second power supply outlet
10 Outlet with GFCI ground leak protection
11 Reset button
12 Circuit test button 13 Kitchen sink wall outlet with GFCI
14 Hot water heater
15 Stove
16 Wall heater unit
17 Fuse box with meter
18 Kitchen smoke alarm
19 Hallway smoke alarm
20 Power strip with signal-activated circuit interrupt
21 Housing
22 Audio alarm receiving port
23 Male plug and cord
24 Female plug receptacle
25 Rocker ON/OFF switch
26 Power status LED
27 Reset button
28 Hazard condition LED indicator
29 Hazard alarm test button
30 Power supply
31 Load
32 Circuit breaker
33 Sensing transformer
34 X-power cut off
35 Amperage variance switching circuit
36 Audio alarm detection subcircuit
37 Female AC plug receptacle
38 LED hazard indicator or emergency light
39 GFCI circuit breaker assembly
40 Signal-activated circuit interrupter
41a Male HOT electric prong
41b Male NEUTRAL electric prong
41c Male GROUND electric prong
42 Portable signal-activated circuit interrupter unit
43 Wall outlet
44a First female AC receptacle
44b Second female AC receptacle
45 Load
46 Smoke alarm
47 Audio alarm receiving port
48 Power status LED
49 Hazard alarm condition LED
50 Audio alarm detector circuit board
50a Audio alarm detector circuit (Part I)
50b Audio alarm detector circuit (Part II) and trip subcircuit
51 Microphone
61 Audio transducer or microphone
62 Alarm delay
63 Select signal or device
64 TRIAC
65 Battery
66 Watchdog
67 Fault Indicator and battery-powered hazard condition LED
68 Board-mounted power supply
69 GFCI protected AC power outlet
90 Smoke alarm
91 Audio microphone or transducer
92 Hazard signal discriminator
93 Alarm verification logic
94 Amperage variance circuit
95 GFCI breaker
96 Common housing or circuit board
97 Integrated signal-activated circuit interrupter with on-board GFCI circuit breaker
100 Portable device
101 Female AC plug receptacle
102 Female AC plug receptacle
103 Female AC plug receptacle
104 Light panel
105 GFCI reset button
106 GFCI test button
107 Power status LED
108 Hazard condition LED
109 Photodiode
110 Smoke alarm
111 Male electric prong
112a Female AC plug receptacle
112b Female AC plug receptacle
113 Wall outlet
115 Smoke
116 Load
120 Signal-activated circuit interrupter
121 Outlet-type signal activated circuit interrupter
122 Sensing transformer
123 Switching circuit
124 First IC for detecting sensing ground leakage
125 Second IC for detecting audio hazard alarm condition
125a Microphone
130 Signal-activated circuit interrupter
131 Rocker lighting switch
132 Nightlight, emergency light, or hazard light bar
133 Hazard or power indicator LED
134 Audio alarm receiving port
135 Female AC plug receptacle
136 Reset button
137 GFCI test button
150 Household wiring plan
151 Stove power supply with signal-activated circuit interrupt and GFCI
152 Kitchen sink power supply with signal-activated circuit interrupt and GFCI
153 Refrigerator power supply
154 Stove
155 Water heater power supply with GFCI
156 Water heater
157 Master fuse box
158 MAINS signal-activated circuit interrupter and GFCI
159 Front door lock
160 Rear door lock
161 Bathroom power supply with signal-activated circuit interrupt and GFCI
162 Wall heater power supply with signal-activated circuit interrupt and GFCI
163 Wall heater
164 Living room power supply with signal-activated circuit interrupt and GFCI
165 Smoke alarm
166 Smoke alarm
167 Natural gas leak detector alarm unit
170 Carbon monoxide detector alarm unit
171 Audio microphone or transducer
172 Hazard signal discriminator
173 Alarm verification logic
174 Amperage variance circuit
175 GFCI breaker
180 Gas leak detector alarm unit
181 Audio microphone or transducer
182 Hazard signal discriminator
183 Alarm verification logic
184 Amperage variance circuit
185 GFCI breaker
186 Alternate circuit breaker assembly
190 General alarm condition detector unit
190a Alarm sound 191 Audio microphone or transducer
192 Hazard signal discriminator
193 Alarm verification logic
194 Breaker trip circuit
200 Alarm network
201 First hazard alarm detector and signal-activated circuit interrupter
202 Second alarm zone
203 Third alarm zone with signal-activated circuit interrupters
204 Fourth alarm zone with signal-activated circuit interrupters
210 Primary audio alarm hazard condition detector unit
211 Secondary audio alarm hazard condition detector unit

We claim:

1. A method of fire prevention by coupling a signal-activated circuit interrupter onto an AC power circuit having an electrical connection to one or more electrical appliances prone to fire, the method comprising:
  a. providing an AC electrical power outlet having at least one grounded female receptacle, a ground fault circuit interrupt device, and one or more power supply circuits wired in series to said ground fault circuit interrupt device, wherein said one or more power supply circuits are enabled to supply electrical power to one or more electrical appliances prone to fire;
  b. providing a signal-activated circuit interrupter, said signal-activated circuit interrupter having:
    i) a male connector with hot, neutral and ground prongs configured for engaging said at least one female receptacle of said AC electrical power outlet;
    ii) a microphone enabled to receive an audio hazard alarm condition and to output an analog signal corresponding to said audio hazard alarm condition;
    iii) a filter subcircuit electrically connected to said microphone, said filter enabled to reject non-specific microphone outputs and to output a digital hazard alarm signal when presented with said analog signal corresponding to said audio hazard alarm condition;
    iv) a watchdog subcircuit enabled to receive said output from said filter subcircuit, to authenticate said digital hazard alarm signal, and to convey an authentication output signal to a trip subcircuit;
    v) wherein said trip subcircuit is configured to receive said authentication output signal and controlledly short an effective amount of current from said hot prong to said ground prong so as to trip said ground fault circuit interrupt device;
  c. plugging said signal-activated circuit interrupter into said at least one female receptacle; and,
  d. microphonically detecting an external audio alarm from said one or more electrical appliances prone to fire; filtering, digitizing and authenticating said alarm; and outputting an authentication output signal to said trip subcircuit; thereby tripping said ground fault circuit interrupt device and cutting electrical power to said one or more electrical appliances.

2. The method of claim 1, comprising microphonically detecting an audio hazard alarm condition of a smoke alarm and outputting an authentication output signal, thereby tripping said ground fault circuit interrupt device.

3. The method of claim 2, wherein said audio hazard alarm condition is defined by a T3 smoke alarm signal having an audio frequency of about 520 Hz or about 3100 Hz with a pattern of pulses, said filter subcircuit comprising a phase lock loop and amplifier, and conveying said digital hazard alarm signal to said watchdog subcircuit.

4. The method of claim 1, wherein said hazard alarm condition is an audible smoke alarm signal having a frequency of about 3100 Hz in a continuous tone, and said watchdog signal is configured to authenticate any digital hazard alarm signal having a time duration of more than a pre-set time duration.

5. The method of claim 1, further comprising a subcircuit for displaying an alarm condition by illuminating an LED when said ground fault circuit interrupter is tripped.

6. The method of claim 1, further comprising a subcircuit for displaying a power status illuminator when said signal-activated interrupter circuit is powered up.

7. The method of claim 1, wherein said trip subcircuit comprises a TRIAC.

8. The method of claim 1, wherein said audio hazard alarm condition is associated with an audible natural gas alarm from a natural gas odor detector and said watchdog circuit is configured to authenticate any digital natural gas alarm signal having a time duration of more than a pre-set time duration.

9. The method of claim 8, wherein said signal-activated circuit interrupter is configured for
  a. microphonically detecting an audible hazard alarm condition associated with a natural gas leak; and in response to an audible tone from a natural gas odor detector;
  b. tripping said ground fault circuit interrupt device, thereby cutting electrical power to a source of electrical spark-related ignition plugged into said electrical power outlet.

10. A method of reducing a carbon monoxide hazard condition by coupling a signal-activated circuit interrupter onto an AC power circuit powering one or more electrical appliances prone to carbon monoxide buildup, the method comprising:
  a. providing an AC electrical power outlet having at least one grounded female receptacle, a ground fault circuit interrupt device, and one or more power supply circuits wired in series to said ground fault circuit interrupt device, wherein said one or more power supply circuits are enabled to supply electrical power to one or more electrical appliances prone to carbon monoxide buildup;
  b. providing a signal-activated circuit interrupter, said signal-activated circuit interrupter having:
    i) a male connector with hot, neutral and ground prongs configured for engaging said at least one female receptacle of said AC electrical power outlet;
    ii) a microphone enabled to receive an audio hazard alarm condition associated with carbon monoxide buildup and to output an analog signal corresponding to said audio hazard alarm condition;
    iii) a filter subcircuit electrically connected to said microphone, said filter enabled to reject non-specific microphone outputs and to output a digital hazard alarm signal when presented with said analog signal corresponding to said audio hazard alarm condition;
    iv) a watchdog subcircuit enabled to receive said output from said filter subcircuit, to authenticate said digital hazard alarm signal, and to convey an authentication output signal to a trip subcircuit;
    v) wherein said trip subcircuit is configured to receive said authentication output signal and controlledly short an effective amount of current from said hot prong to said ground prong so as to trip said ground fault circuit interrupt device;

c. plugging said signal-activated circuit interrupter into said at least one female receptacle; and, d. microphonically detecting an external audio alarm from said one or more electrical appliances associated with carbon monoxide buildup; filtering, digitizing and authenticating said alarm; and outputting an authentication output signal to said trip subcircuit; thereby tripping said ground fault circuit interrupt device and cutting electrical power to said one or more electrical appliances prone to leak carbon monoxide.

11. The method of claim 10, wherein said audio hazard alarm condition is an audible alarm from a carbon monoxide detector and said watchdog circuit is configured to authenticate any carbon monoxide alarm signal based on a frequency and a duration of more than a pre-set duration.

12. The method of claim 11, wherein said signal-activated circuit interrupter is configured for:
   a. microphonically detecting an audible hazard alarm condition associated with a carbon monoxide buildup; and in response to an audible tone from a carbon monoxide detector; and,
   b. tripping said ground fault circuit interrupt device, thereby cutting electrical power to a source of electrical spark-related ignition plugged into said electrical power outlet.

13. An apparatus for preventing electrical ignition of a fire in AC power circuits having an electrical connection to one or more electrical appliances prone to fire, said apparatus comprising:
   a. a signal-activated circuit interrupter comprising:
      i) a male connector with hot, neutral and ground prongs configured to engage at least one female receptacle of an AC power circuit having a ground fault circuit interrupt device wherein one or more power supply circuits and at least one female receptacle are wired in series to the ground fault circuit interrupt device;
      ii) a microphone enabled to receive an audio hazard alarm condition and to output an analog signal corresponding to said audio hazard alarm condition;
      iii) a filter subcircuit electrically connected to said microphone, wherein said filter is enabled to reject non-specific microphone outputs and to output a digital hazard alarm signal when presented with said analog signal corresponding to said audio hazard alarm condition;
      iv) a watchdog subcircuit enabled to receive said output from said filter subcircuit, to authenticate said digital hazard alarm signal, and to convey an authentication output signal to a trip subcircuit; and, b) wherein said trip subcircuit is configured to receive said authentication output signal and controlledly short an effective amount of current from said hot prong to said ground prong so as to trip said ground fault circuit interrupt device, thereby tripping said ground fault circuit interrupt device and cutting electrical power to said one or more electrical appliances.

14. The apparatus of claim 13, wherein said filter subcircuit comprises a plurality of filters that may be selected by a dipswitch.

15. The apparatus of claim 14, wherein plurality of filters are selected to output a digital hazard alarm signal corresponding to an audio hazard alarm condition selected from:
   a) a smoke alarm;
   b) a natural gas alarm;
   c) a carbon monoxide alarm;
   d) a flammable gas alarm;
   e) a toxic fumes alarm;
   f) a motor overload-associated chemical emission;
   g) a ground fault alarm; or
   h) a radon alarm.

16. The apparatus of claim 13, wherein said filter subcircuit is configured to detect a T3 smoke alarm signal having an audio frequency of about 520 Hz or about 3100 Hz with a pattern of pulses, said filter subcircuit comprising a phase lock loop and amplifier for outputting a digital hazard alarm signal to a watchdog subcircuit.

17. The apparatus of claim 13, wherein said filter subcircuit is configured to detect a an audible smoke alarm signal having a frequency of about 3100 Hz in a continuous tone, and said watchdog signal is configured to authenticate any digital hazard alarm signal having a time duration of more than a pre-set time duration.

18. The apparatus of claim 13, further comprising a subcircuit enabled to illuminate an LED when said ground fault circuit interrupter is tripped.

19. The apparatus of claim 13, further comprising a subcircuit enabled to illuminate a power status illuminator when said signal-activated interrupter circuit is powered on.

20. The apparatus of claim 13, wherein said trip subcircuit comprises a TRIAC.

21. The apparatus of claim 13, further comprising a speaker for emitting an audio alarm signal having a unique signature, wherein said signal is enabled to propagate an alarm through a network of said signal-activated circuit interrupters, each said signal-activated circuit interrupters of said network further having a filter for activating when said unique signature is received by said microphone thereof.

* * * * *